United States Patent
Ahn et al.

(10) Patent No.: US 12,506,091 B2
(45) Date of Patent: Dec. 23, 2025

(54) ANODIZED FILM SUBSTRATE BASE, ANODIZED FILM SUBSTRATE PART HAVING SAME, ANODIZED FILM-BASED INTERPOSER HAVING SAME, AND SEMICONDUCTOR PACKAGE HAVING SAME

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Sung Hyun Byun, Gyeonggi-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 431 days.

(21) Appl. No.: 18/015,711

(22) PCT Filed: Jul. 27, 2021

(86) PCT No.: PCT/KR2021/009724
§ 371 (c)(1),
(2) Date: Jan. 11, 2023

(87) PCT Pub. No.: WO2022/025593
PCT Pub. Date: Feb. 3, 2022

(65) Prior Publication Data
US 2023/0290740 A1 Sep. 14, 2023

(30) Foreign Application Priority Data
Jul. 29, 2020 (KR) .................. 10-2020-0094602

(51) Int. Cl.
*H01L 23/02* (2006.01)
*H01L 23/00* (2006.01)
(Continued)

(52) U.S. Cl.
CPC ............ *H01L 23/562* (2013.01); *H01L 23/14* (2013.01); *H01L 23/32* (2013.01);
(Continued)

(58) Field of Classification Search
CPC ....... H01L 23/562; H01L 23/14; H01L 23/32; H01L 23/49816; H01L 23/49827;
(Continued)

(56) References Cited

U.S. PATENT DOCUMENTS

2017/0316881 A1* 11/2017 Bachman ............... H01L 23/552
2021/0363653 A1* 11/2021 Hotta ..................... B82Y 40/00

FOREIGN PATENT DOCUMENTS

JP          5362104        12/2013
JP       2019149448         9/2019
(Continued)

OTHER PUBLICATIONS

"International Search Report (Form PCT/ISA/210) of PCT/KR2021/009724," mailed on Nov. 2, 2021, with English translation thereof, pp. 1-6.
(Continued)

*Primary Examiner* — Theresa T Doan
(74) *Attorney, Agent, or Firm* — JCIPRNET

(57) ABSTRACT

The present invention relates to an anodized film substrate base made of an anodized oxide film, an anodized film substrate part including a vertical conductive part provided inside the anodized film substrate base, an anodized film-based interposer having same, and a semiconductor package having same.

17 Claims, 36 Drawing Sheets

(51) Int. Cl.
  *H01L 23/14* (2006.01)
  *H01L 23/32* (2006.01)
  *H01L 23/498* (2006.01)
  *H01L 23/525* (2006.01)
  *H01L 23/528* (2006.01)
  *H01L 25/065* (2023.01)

(52) U.S. Cl.
  CPC .. *H01L 23/49816* (2013.01); *H01L 23/49827* (2013.01); *H01L 23/525* (2013.01); *H01L 23/528* (2013.01); *H01L 24/16* (2013.01); *H01L 24/32* (2013.01); *H01L 24/73* (2013.01); *H01L 25/0652* (2013.01); *H01L 2224/16145* (2013.01); *H01L 2224/32225* (2013.01); *H01L 2224/73204* (2013.01)

(58) Field of Classification Search
  CPC ..... H01L 23/525; H01L 23/528; H01L 24/16; H01L 24/32; H01L 24/73; H01L 25/0652; H01L 2224/16145; H01L 2224/32225; H01L 2224/73204; H01L 23/66; H01L 25/18; H01L 2225/06513; H01L 2225/06541; H01L 2225/06568; H01L 21/561; H01L 21/568; H01L 25/50; H01L 21/6835; H01L 23/3128; H01L 23/49822; H01L 23/5384; H01L 23/5385; H01L 2221/68345; H01L 2224/16225; H01L 2224/32145; H01L 2924/15311; H01L 23/13
  USPC .......................................................... 257/686
  See application file for complete search history.

(56) References Cited

FOREIGN PATENT DOCUMENTS

| | | |
|---|---|---|
| KR | 20090024406 | 3/2009 |
| KR | 20110111803 | 10/2011 |
| KR | 20140020114 | 2/2014 |
| KR | 20140040668 | 4/2014 |
| KR | 101538539 | 7/2015 |
| KR | 20170139321 | 12/2017 |

OTHER PUBLICATIONS

"Office Action of Korea Counterpart Application", issued on Jan. 20, 2025, with English translation thereof, p. 1-p. 24.

* cited by examiner

ANODIZED FILM SUBSTRATE BASE, ANODIZED FILM SUBSTRATE PART HAVING SAME, ANODIZED FILM-BASED INTERPOSER HAVING SAME, AND SEMICONDUCTOR PACKAGE HAVING SAME

TECHNICAL FIELD

The present invention relates to an anodized film substrate base, an anodized film substrate having the same, an anodized film-based interposer having the same, and a semiconductor package having the same.

BACKGROUND ART

Recently, demand for products that are lightweight, small-sized, high-speed, multifunctional, high-performance, and highly reliable has been growing in the electronics industry, such as mobile phone and laptop industries. As one solution to satisfy such demand, a method of applying an interposer to a semiconductor package has been proposed. An interposer can be interposed between a plurality of semiconductor chips in a semiconductor package so that the plurality of semiconductor chips are vertically stacked to form a three-dimensional stacked package. In addition, the interposer can be interposed between a semiconductor chip and package substrate for a redistribution function and a prevention function of connection defects occurring between the semiconductor chip and the package substrate. Recently, research has been conducted on enhancing the reliability and electrical characteristics of semiconductor packages using interposers.

When it comes to interposers for semiconductor packages, silicon and glass are the most effective base materials so far. An interposer using silicon as a base material is referred to as a silicon-based interposer, and an interposer using glass as a base material is referred to as a glass-based interposer.

The silicon-based interposer is fabricated by through-silicon via (TSV) technology in which via holes are processed in a silicon substrate, and the inside of the via hole is filled with conductive metals such as copper. The silicon-based interposer is fabricated by forming via holes in a predetermined portion of a silicon substrate, by forming an insulating film and a diffusion barrier film in the via hole, and by depositing conductive metal, such as copper, in the via holes. Since silicon is used as a base material, the silicon substrate interposer has an advantage in that a semiconductor can be manufactured through an in-line process.

However, in the case of interposer technology based on silicon, since a silicon material is the base material, there are disadvantages of poor electrical signal transmission characteristics and high manufacturing costs. In addition, in the silicon-based interposers, thin film processes are required to be performed by first forming via holes on a first surface of a silicon substrate and then performing a CMP polishing process on a second surface of the silicon substrate. As a result, there are problems of a large number of manufacturing processes and alignment errors occurring when both sides of the substrate are processed.

To replace such silicon-based interposers, research is in progress on glass-based interposers using glass, a material with high insulation resistance, as a base material instead of silicon. The glass-based interposer is fabricated by through-glass via (TGV) technology in which via holes are processed in glass and the inside of the via hole is filled with conductive metals, such as copper. Since glass itself is an insulating material, thin film processes in which an insulating film and a diffusion barrier film are formed as in TSV are unnecessary.

However, in the case of interposer technology based on glass, via holes fail to be formed in a vertical shape when using a laser for via hole formation, so there is a problem of unstable current flow. In addition, thermal stress is generated around the via holes due to the laser, so there is a problem in that cracks easily occur. Furthermore, a method of forming via holes using a laser drilling method requires a substantial investment in laser equipment due to the increased number of laser sots, and expansive laser equipment is required due to the size reduction of via holes, so there is a problem of an increase in manufacturing costs.

As described above, the silicon-based interposers or glass-based interposers have limitations in responding to technological trends of the miniaturization of semiconductor chips.

Even though interposer technologies using a resin material or ceramic material as a base material have been proposed as well, via holes formed through existing means for forming via holes have irregular via hole diameters in a thickness direction of a substrate. As a result, aspect ratios are low, and miniaturization of via hole diameters and narrowing of pitch are limited. Furthermore, even though via holes with high aspect ratios and sufficiently regular via hole diameters can be formed in the thickness direction of the substrate, there is a problem in that the manufacturing process requires a long time, resulting in a significant increase in manufacturing costs.

DOCUMENT OF RELATED ART

Patent Document (Patent Document 1) Korean Patent Application Publication No. 2011-0111803

DISCLOSURE OF INVENTION

Technical Problem

The present invention has been made to provide solutions to the above problems. An objective of the present invention is to provide an anodized film substrate base to solve the problems in the related art using an anodized film material, an anodized film substrate having the same, an anodized film-based interposer having the same, and a semiconductor package having the same.

Solution to Problem

According to one aspect of the present invention, a semiconductor package includes: a semiconductor chip; and an anodized film-based interposer on which the semiconductor chip is mounted, in which the anodized film-based interposer includes an anodized film substrate made of an anodized film and including a vertical conductive part provided therein.

In addition, the anodized film-based interposer includes a redistribution part provided on at least one surface of the anodized film substrate.

In addition, a package substrate is provided under the anodized film-based interposer so that the anodized film-based interposer is interposed between the semiconductor chip and the package substrate.

According to one aspect of the present invention, an anodized film-based interposer includes: an anodized film substrate including a vertical conductive part provided in an anodized film substrate base made of an anodized film material; and a redistribution part provided on at least one surface of the anodized film substrate.

According to one aspect of the present invention, an anodized film substrate includes: an anodized film substrate base made of an anodized film material; and a vertical conductive part provided in the anodized film substrate base.

In addition, a support substrate is provided on at least one surface of the anodized film substrate base.

In addition, the vertical conductive part is provided in a through hole formed by etching the anodized film to have a larger size than a pore formed during anodizing.

In addition, the vertical conductive part is provided in the pore during anodizing.

In addition, a clearance is formed between the through hole and the vertical conductive part.

In addition, the vertical conductive part includes a main conductive part and a buffer part being in contact with the main conductive part.

In addition, a via-connection pad is formed on the anodized film substrate base and being in contact with the vertical conductive part, in which one of the via-connection pads is connected to a plurality of the vertical conductive parts.

In addition, a depression is formed by removing at least a portion of the anodized film.

According to one aspect of the present invention, an anodized film substrate base is made of an anodized film formed by anodizing a base metal and then removing the base metal, the anodized film substrate base including a through hole formed by etching the anodized film to have a larger size than a pore formed during the anodizing.

In addition, a depression is formed by removing at least a portion of the anodized film.

In addition, the through hole has a polygonal cross-section.

In addition, a barrier layer is formed at least one surface side of the anodized film substrate base during the anodizing to seal one end of the pore.

In addition, the sealed end of the pore is unsealed by removing the barrier layer formed on the at least one surface side of the anodized film substrate base during the anodizing.

In addition, a support substrate is provided on at least one surface of the anodized film substrate base.

Advantageous Effects of Invention

When an anodized film-based interposer, according to a preferred embodiment of the present invention, is interposed between a semiconductor chip and a package substrate, the problem caused by a difference in a thermal expansion rate between the package substrate and the semiconductor chip can be solved. The anodized film-based interposer, according to a preferred embodiment of the present invention, has a thermal expansion rate ranging between a thermal expansion rate of the semiconductor chip made of a silicon and a thermal expansion rate of the package substrate made of an organic material, so stress caused by the difference in the thermal expansion rate can be relieved. Accordingly, it is possible to prevent cracks from occurring at a junction between the package substrate and the semiconductor chip or damage to the semiconductor chip when the package substrate and the semiconductor chip are cooled after a soldering process is completed.

While an existing silicon-based interposer or glass-based interposer uses silicon or glass as a base material, respectively, there is a compositional difference in that the anodized film-based interposer, according to a preferred embodiment of the present invention, is based on the anodized film. Due to the fundamental compositional difference regarding the base material as mentioned above, the anodized film-based interposer, according to a preferred embodiment of the present invention, has the following advantages, unlike the existing interposer.

First, an anodized film substrate base itself has insulating properties, so thin film process required for the silicon-based interposer, in which an insulating film, a diffusion barrier film, and the like are formed, are unnecessary. In addition, given that many through holes are formed at once through a single etching process, expansive laser equipment required for the glass-based interposer is unnecessary.

Second, the through hole formed in the anodized film substrate base has a vertical inner wall, and there is no restriction on the shape of the through hole. In the case of the silicon-based interposer, expansive dry etching equipment is required to form vertical through holes. However, in this case, there are problems in that manufacturing costs increase and manufacturing time takes longer. In addition, when using a laser, shapes of via holes are subject to certain constraints.

Third, unlike the silicon-based interposer or glass-based interposer, the anodized film-based interposer, according to a preferred embodiment of the present invention, is composed of a plurality of pores having diameters in a range of several nm to several hundreds of nm in the regions between vertical conductive parts. The plurality of the pores between the vertical conductive parts perform a function of blocking horizontal heat transmission according to a temperature change in the vertical conductive parts. The plurality of the pores block heat transmission in the horizontal direction in the anodized film substrate base by exhibiting a function capable of having a plurality of air columns. In the case of the silicon-based interposer, via conductors are required to be spaced from each other by 5 µm or more since the heat generated according to the temperature change in the via conductor is transmitted to the peripheral via conductors. However, in the anodized film-based interposer according to a preferred embodiment of the present invention, the heat generated from the vertical conductive parts is blocked from being transmitted to the peripheral vertical conductive parts. As a result, the vertical conductive parts can be disposed at further fine-pitch intervals, thereby effectively responding to the miniaturization of the semiconductor chips. Thus, the anodized film-based interposer, according to a preferred embodiment of the present invention, can improve the density of the semiconductor chip and minimize peripheral heat transmission, thereby improving the electrical properties and reliability of the semiconductor chip.

Fourth, unlike the silicon-based interposer or glass-based interposer, the amount of capacitive coupling component generated by a parasitic capacitor between the vertical conductive parts can be reduced through the configuration in which the plurality of the pores are formed between the vertical conductive parts. As a result, the vertical conductive parts can stably transmit signals.

As described above, the anodized film-based interposer, according to a preferred embodiment of the present invention, can solve the problems occurring in the existing silicon-based interposer or glass-based interposer, and can significantly reduce manufacturing costs. In addition, the effects enabling stable transmission of signals and miniaturization of semiconductor chips, which are limited to be achieved in the existing silicon material or glass material, can be expressed.

DESCRIPTION OF THE EMBODIMENTS

Figure 1:
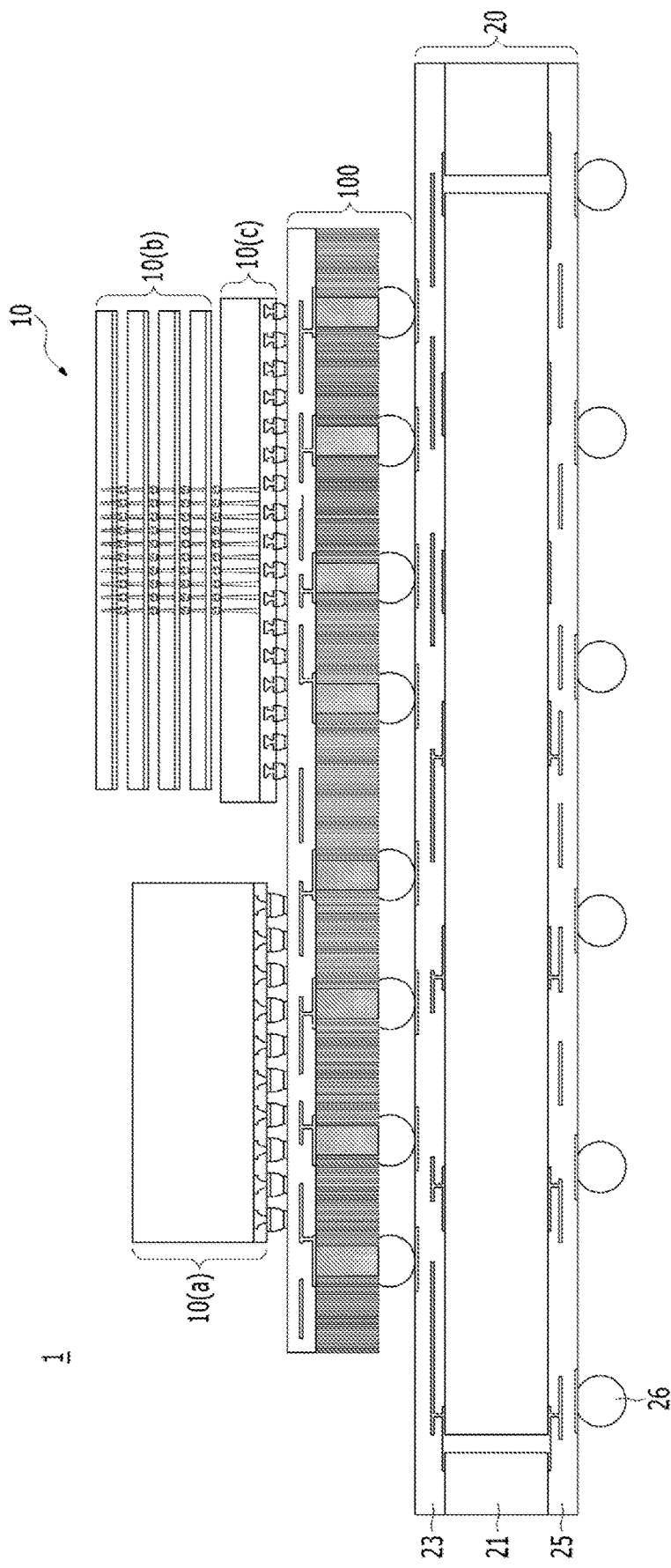
FIG. 1 is a cross-sectional view of a semiconductor package according to a preferred embodiment of the present invention.

In the following description, the structural or functional description specified to exemplary embodiments according to the concept of the present invention is intended to describe the exemplary embodiments, so it should be understood that the present invention may be variously embodied, without being limited to the exemplary embodiments.

The embodiments described herein will be described with reference to cross-sectional views that are ideal illustrations of the present invention. The thicknesses of the films and regions and the diameters of the holes illustrated in the drawings are exaggerated for an effective description of the technical idea. The shape of the illustrations may be modified according to manufacturing techniques and/or tolerances.

The exemplary embodiments according to the concept of the present invention may be variously modified and may have various shapes, so examples of which are illustrated in the accompanying drawings and will be described in detail with reference to the accompanying drawings. However, it should be understood that the exemplary embodiments according to the concept of the present invention are not limited to the embodiments which will be described hereinbelow with reference to the accompanying drawings, but various modifications, equivalents, additions and substitutions are possible, without departing from the scope and spirit of the invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Hereinafter, a preferred embodiment of the present invention will be described in detail with reference to FIGS. 1 to 12.

FIG. 1 is a cross-sectional view of a semiconductor package according to a preferred embodiment of the present invention. According to a preferred embodiment of the present invention, a semiconductor package 1 includes a semiconductor chip 10, an anodized film-based interposer 100, and a package substrate 20. The semiconductor chip 10 is mounted on the anodized film-based interposer 100 to be primarily packaged, and then mounted on the package substrate 20 to be secondarily packaged to constitute the semiconductor package 1.

The semiconductor chip 10 may be a memory chip including a chip pad with fine pitch, a microprocessor chip, a logic chip, or a combination thereof. The semiconductor chip 10 may be flip-chip bonded to the anodized film-based interposer 100. The semiconductor chip 10 is not particularly limited, and examples thereof include a logic LSI (such as an ASI, an FPGA, and an ASSP), a microprocessor (such as a CPU and a GPU), a memory (such as a DRAM, a hybrid memory cube (HMC), a magnetic RAM (MRAM), a phase-change memory (PCM), a resistive RAM (ReRAM), a ferroelectric RAM (FeRAM), and a flash memory (NAND flash)), an LED, a power device, an analog IC (such as a DC-AC converter and an insulated-gate bipolar transistor (IGBT)), an MEMS (such as an acceleration sensor, a pressure sensor, a vibrator, and a gyro-sensor), a wireless device (such as a GPS, an FM, an NFC, an RFEM, an MMIC, and a WLAN), a discrete device, BSI, CIS, a camera module, CMOS, a passive device, a GAW filter, an RF filter, an RF IPD, an APE, and a BB.

As one example, a first semiconductor chip 10(*a*) in FIG. 1 may be a microprocessor (such as a CPU and a GPU), and a second semiconductor chip 10(*b*) may be a stacked chip in which memories (such as a DRAM, a hybrid memory cube (HMC), a magnetic RAM (MRAM), a phase-change memory (PCM), a resistive RAM (ReRAM), a ferroelectric RAM (FeRAM), and a flash memory (NAND flash)) are stacked in a multilayer structure and connected to each other by TSV. In addition, a third semiconductor chip 10(*c*) may be a logic LSI (such as an ASIC, an FPGA, and an ASSP).

The second semiconductor chip 10(*b*) may be electrically connected to the third semiconductor chip 10(*c*) by TSV. In addition, the first semiconductor chip 10(*a*) may be electrically connected to the second semiconductor chip 10(*b*) and the third semiconductor chip 10(*c*). As one example, the first semiconductor chip 10(*a*) may be electrically connected to the second semiconductor chip 10(*a*) through a redistribution part 150.

The package substrate 20 is provided under the anodized film-based interposer 100. The package substrate 20 may include a substrate base 21 and an upper wiring layer 23 and a lower wiring layer 25 formed on an upper surface and a lower surface of the package substrate 20, respectively.

The substrate base 21 of the package substrate 20 may be made of at least one selected from phenol resin, epoxy resin, and polyimide. For example, the substrate base 21 may include at least one selected from FR4, tetrafunctional epoxy, polyphenylene ether, epoxy/polyphenylene oxide, bismaleimide triazine (BT), Thermount, cyanate ester, polyimide, and liquid crystalline polymer. An external connection terminal 26 may be provided under the lower wiring layer 25.

Figure 2:
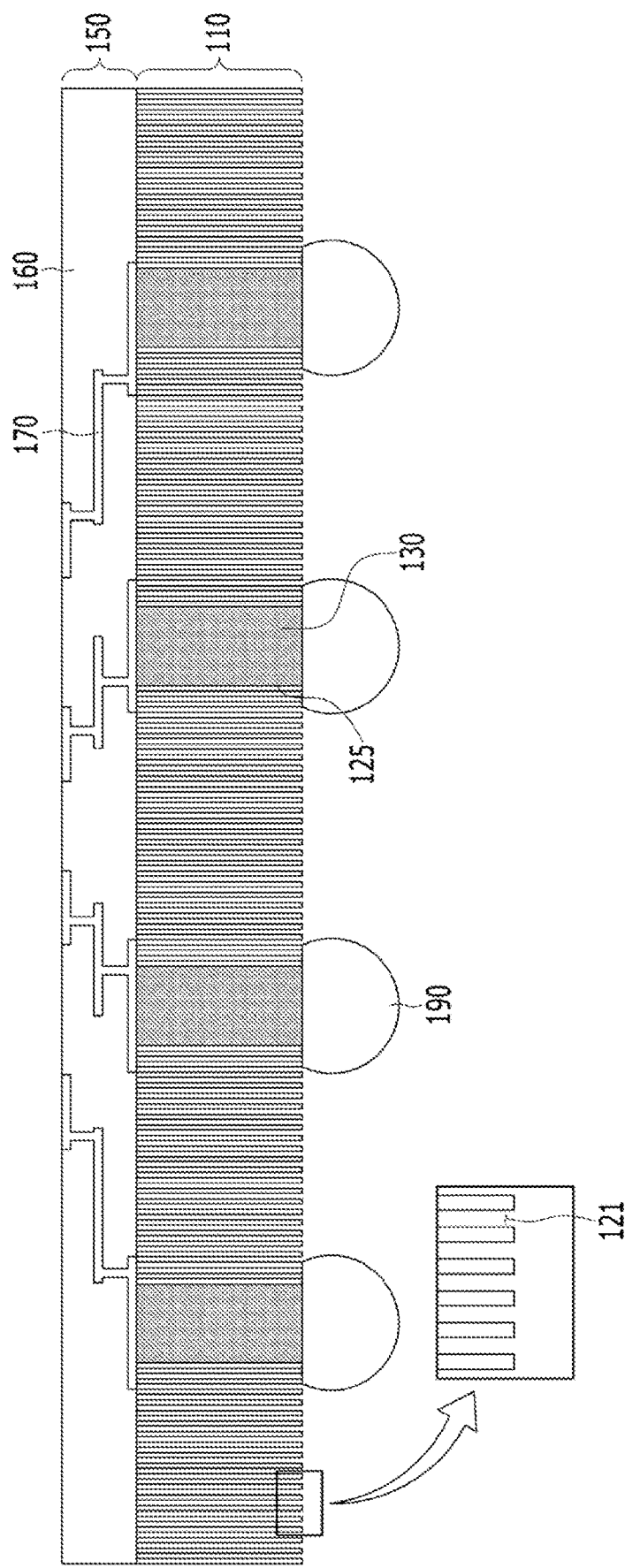
FIG. 2 is a cross-sectional view of an anodized film-based interposer according to a preferred embodiment of the present invention.

FIG. 2 is a cross-sectional view of an anodized film-based interposer according to a preferred embodiment of the present invention.

The anodized film-based interposer 100 includes an anodized film substrate 110 and the redistribution part 150 provided on at least one surface of the anodized film substrate 110.

The redistribution part 150 may be provided on one of an upper surface and a lower surface of the anodized film substrate 110, and may be provided on both of the upper surface and lower surface of the anodized film substrate 110.

The redistribution part 150 includes an insulating layer 160 and a wiring pattern 170. The insulating layer 160 may include silicon oxide, silicon nitride, silicon carbide, silicon oxynitride, Low-K dielectric materials such as PSG, BPSG, FSG, $SiO_xC_y$, spin-on-glass, and spin-on-polymer, silicon carbon materials, compounds thereof, mixtures thereof, combinations thereof, and the like. The insulating layer 160 may be formed by a method, such as spinning, CVD, PECVD, HDP-CVD, and the like.

For example, the wiring pattern 170 may be formed on the insulating layer 160 by forming a photoresist layer on the insulating layer 160 using photolithography and patterning the same so that a portion of the insulating layer 160 to be the wiring pattern 170 is unsealed. An etching process, such as an anisotropic dry etching process, may be used to form recesses and/or openings in the insulating layer 160 corresponding to the unsealed portions of the insulating layer 160. The recesses and/or openings may be lined with a diffusion barrier layer (not shown) and filled with a conductive material to constitute the wiring pattern 170. The diffusion barrier layer may include at least one layer made of materials such as TaN, Ta, TiN, Ti, CoW, and the like formed by ALD. In addition, the conductive material constituting the wiring pattern 170 may include copper, aluminum, tungsten, silver, and combinations thereof formed by CVD, PVD, and the like. Any of the excess diffusion barrier layer and/or conductive material on the insulating layer 160 may be removed, for example, by CMP.

The wiring pattern 170 may have a monolayer structure. Alternatively, the wiring pattern 170 may have a multilayer structure according to pitch intervals of the chip pads in the semiconductor chip 10 and the degree of wiring complexity. The layer structure of the wiring pattern 170 and a position between the upper surface and lower surface of the anodized film substrate 110 to form the redistribution part 150 may be appropriately determined according to a wiring design between the semiconductor chip 10 and the package substrate 30.

The anodized film substrate 110 includes an anodized film substrate base 120. The anodized film substrate base 120 is made of only an anodized film formed by anodizing a base metal and then removing the base metal. The anodized film indicates a film formed by anodizing the base metal, and a pore 121 indicates a hole formed in the process of forming the anodized film by anodizing the base metal.

As one example, in the case of the base metal made of aluminum (Al) or an aluminum alloy, when anodizing the base metal, an anodized film made of anodized aluminum oxide ($Al_2O_3$) is formed on a surface of the base metal.

Figure 10A:
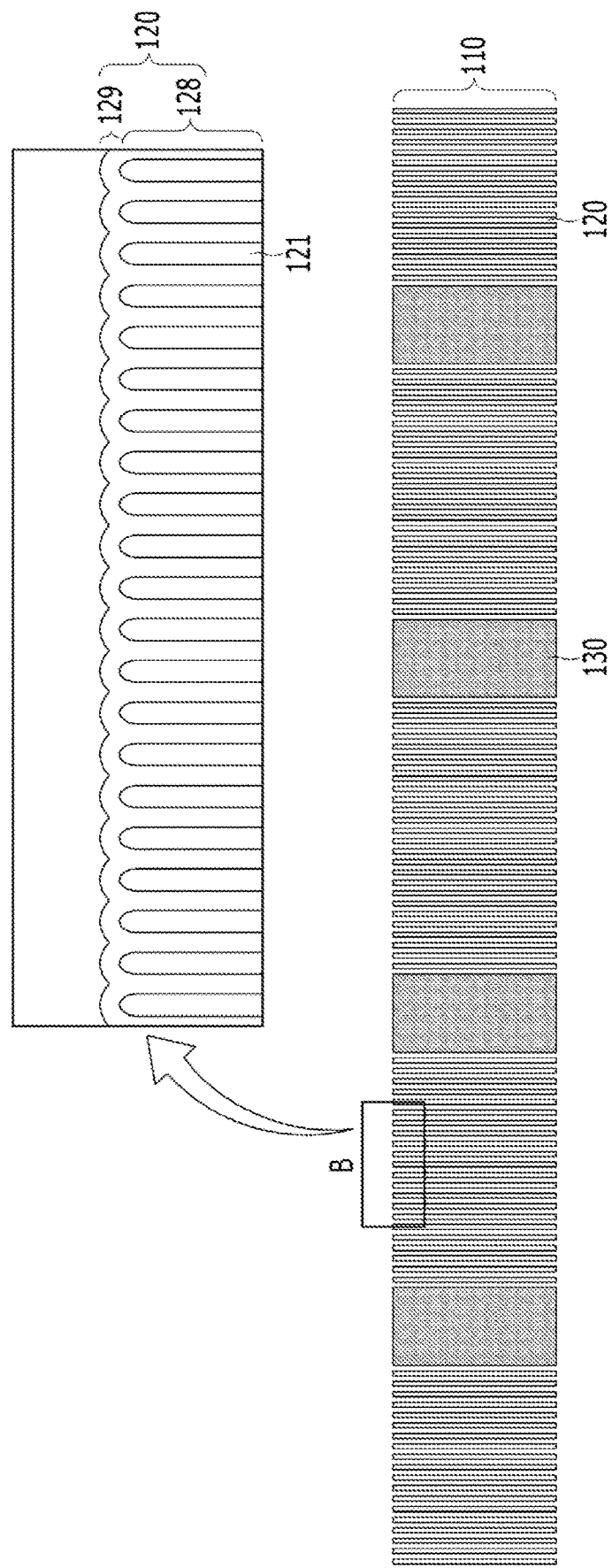
FIG. 10A is a cross-sectional view illustrating an anodized film substrate according to a preferred embodiment of the present invention.

The anodized film may include a porous layer 128 having the pore 121 formed therein and a barrier layer 129 sealing the pore 121 at one end of the pore 121 (see FIG. 10A). The barrier layer 129 is formed on top of the base material during the anodizing, and the porous layer 128 is formed on top of the barrier layer 129. Specifically, when anodizing the base metal, the barrier layer 129 is first formed on the base metal. Then, when the barrier layer 129 has a predetermined thickness, the porous layer 128 is formed on the barrier layer 129. A thickness of the barrier layer 129 may vary depending on anodization process conditions. The barrier layer 129 preferably has a thickness in a range of several tens of nm or more to several µm or less, and more preferably in the range of 100 nm or more to 1 µm or less. A thickness of the porous layer 128 may also vary depending on anodization process conditions. The porous layer 128 preferably has a thickness in a range of several tens of nm or more to several hundreds of µm or less. The pore 121 constituting the porous layer 128 may have a diameter in a range of several nm or more to several hundred nm or less. A process of removing the base metal may be performed after the anodizing process is completed. Through the process, the anodized film made of anodized aluminum oxide ($Al_2O_3$) remains. The anodized film substrate base 120 uses such an anodized film.

The anodized film substrate base 120 may be an anodized film substrate base 120 including the barrier layer 129 formed on at least one surface side of the anodized film substrate base 120 during the anodizing to seal one end of the pore 121 (see FIG. 10A). Alternatively, the anodized film substrate base 120 may be an anodized film substrate base 120 in which both ends of the pore 121 are unsealed by removing the barrier layer 129 formed on the at least one surface side of the anodized film substrate base 120 during the anodizing (see FIG. 10B). As described above, the anodized film substrate base 120 may have a structure in which the porous layer 128 and the barrier layer 121 are provided together, or provided with the porous layer 128 by removing the barrier layer 121.

The anodized film substrate base 120 has a through hole 125 having separately from the pore 121, the trough hole having a larger size than the pore 121. The through hole 125 may have a size in a range of several μm or more to several tens of μm or less. The through hole 125 may be formed by an etching process. Using an etching solution (for example, an alkaline solution) that causes a wet reaction with the anodized film, a plurality (as an example, in a range of tens of thousands to several million) of the through holes 125 may be formed at once with the single etching process. Therefore, the through hole 125 has advantages in terms of production speed and manufacturing costs compared to an existing process in which one via hole is formed at a time.

The through hole 125 may be formed by forming a photoresist on one surface of the anodized film substrate base 120 and patterning the photoresist to form an opening area, and then flowing the etching solution through the opening area. As a result, a shape of the patterned opening area is directly copied, and a cross-sectional shape of the through hole 125 is thus formed.

The anodized film substrate 110 includes the anodized film substrate base 120 and a vertical conductive part 130 provided in the anodized film substrate base 120.

The through hole 125 of the anodized film substrate base 120 is provided with a conductive material in the to form the vertical conductive part 130. Here, the conductive material may include copper, tungsten, aluminum, gold, silver, molybdenum, tantalum, solder, indium, or an alloy thereof.

The through hole 125 is formed through the etching process using the patterned photoresist as a mask, so there is no restriction on the cross-sectional shape of the through hole 125. In addition, an inner wall of the through hole 125 formed by the reaction between the anodized film and the etching solution has a vertical shape. The conductive material fills the inside of the through hole 125 having the vertical inner wall to form the vertical conductive part 130. The vertical conductive part 130 formed in the through hole 125 is provided in the form of a vertical pillar in the anodized film substrate base 120. The vertical conductive part 130 has the same cross-sectional area from one end to the other end of the anodized film substrate base 120. As a result, there is an advantage in that electricity smoothly flows, compared to via conductors incapable of forming a vertical inner wall. In the case of the via conductor not only being incapable of forming the vertical inner wall, but also having a cross-sectional area that decreases from one end to the other end, or toward the center, a thermal bottleneck and an electrical bottleneck occur. However, the vertical conductive part 130, according to a preferred embodiment of the present invention, has the same cross-sectional area from one end to the other end, so neither the thermal bottleneck nor the electrical bottleneck appears.

A method of filling the through hole 125 with the conductive material includes electroplating, electroless plating, or selective deposition. Since the through hole 125 is formed by the etching process in the anodized film substrate base 120 according to a preferred embodiment of the present invention, a high aspect ratio can be realized. When filling the through hole 125 having a high aspect ratio with the conductive material, it is critical to prevent the occurrence of voids in the vertical conductive part 130.

A substrate for a conventional silicon-based interposer adopts a method of forming a seed layer in a via hole and forming a via conductor by electroplating using the seed layer. However, according to the related art, since a bottom surface and an inner wall of the via hole are simultaneously plated, there is a problem in that voids are generated in the via conductor when the aspect ratio of the via hole is high. However, in the case of the vertical conductive part 130 according to a preferred embodiment of the present invention, a metal seed substrate is placed under the anodized film having the through hole 125 vertically penetrated. Then, the vertical conductive part 130 is formed by electroplating, in which a plated layer is deposited in one direction (in a direction from the bottom of the through hole 125 to the top). As a result, no voids are generated in the vertical conductive part 130.

The anodized film substrate 110 may include a support substrate 140 provided on at least one surface of the anodized film substrate base 120.

Since a substrate for a silicon-based interposer undergoes a process in which a via conductor and a wiring portion are first formed on an upper surface of a silicon wafer with a sufficient thickness, and a lower surface is then processed by inverting the silicon wafer, handling can be easy. However, the anodized film substrate base 120 is manufactured to have a thickness in a range of several tens of μm to several hundreds of μm through the anodizing process, and the through hole 125 is formed to vertically penetrate the anodized film substrate base 120. As a result, there is concern about brittle fractures of the anodized film substrate base 120 during transportation and/or handling of the anodized film substrate base 120. In particular, in the anodized film substrate base 120, a depression 123 may be formed in advance along a dicing line, so brittle fractures of the anodized film substrate base 120 may easily occur during the transportation and/or handling of the anodized film substrate base 120. To prevent such concern, the anodized film substrate 110, according to the preferred embodiment of the present invention, may include the support substrate 140 provided on the at least one surface of the anodized film substrate base 120. The support substrate 140 may be formed of silicon, germanium, silicon-germanium, gallium-arsenic (GaAs), glass, plastic, ceramic substrate, resin, and the like. In addition, the support substrate 140 prevents deformation of the anodized film substrate base 120 during a post-process, and facilitates the transportation and/or handling of the anodized film substrate base 120. The support substrate 140 may be attached to the anodized film substrate base 120 due to an adhesive layer. The adhesive layer may be formed by using NCF, ACF, an instant adhesive, a thermosetting adhesive, a laser curing adhesive, an ultrasonic curing adhesive, NCP, or the like.

Hereinafter, the anodized film substrate 110 will be described with reference to FIGS. 3 to 12. According to a preferred embodiment of the present invention, the anodized film substrate 110 may include at least one component of the embodiment described with reference to FIGS. 3 to 12.

Figure 3A:
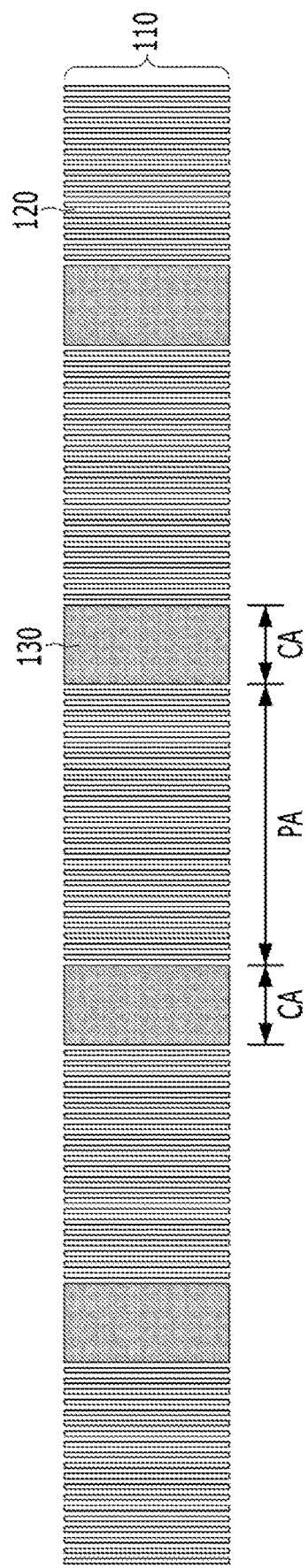
FIG. 3A is a cross-sectional view of an anodized film substrate according to a preferred embodiment of the present invention.
Figure 3B:
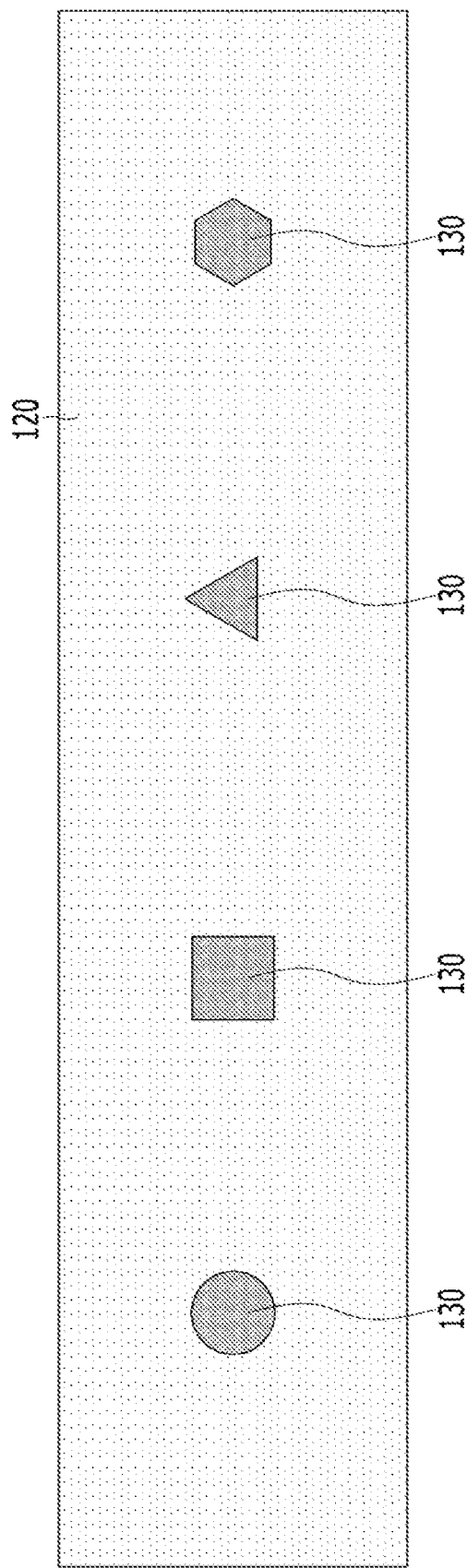
FIG. 3B is a plan view illustrating an anodized film substrate according to a preferred embodiment of the present invention.

FIG. 3A is a cross-sectional view of an anodized film substrate according to a preferred embodiment of the present invention, and FIG. 3B is a plan view illustrating an anodized film substrate according to a preferred embodiment of the present invention.

Referring to FIGS. 3A and 3B, the anodized film substrate base 120 includes a conductive area CA and a pore area PA formed to surround the conductive area CA around the conductive area CA. The conductive area CA may be formed by filing the through hole 125 formed by etching the anodized film with the conductive material to have a larger size than the pore 121 formed during the anodizing. As another example, the conductive area CA may be formed by filling the pore 121 formed during the anodizing with the conductive material. The conductive area CA may be an electrically conductive area being electrically connected to the semiconductor chip 10. Alternatively, the conductive area CA may be a thermally conductive area releasing heat from the semiconductor chip 10 without being electrically connected to the semiconductor chip 10.

The conduction area CA may be an area vertically conducting electricity or heat through the vertical conductive part 130. When the vertical conductive part 130 is made of a material with high electrical conductivity, the conductive area CA becomes an electrically conductive area. In addition, when the vertical conductive part 130 is made of a material with high thermal conductivity, the conductive area CA becomes a thermal conductive area. Here, the material with high electrical conductivity may include copper, tungsten, aluminum, gold, silver, molybdenum, tantalum, solder, indium, or an alloy thereof. In addition, the material with high thermal conductivity may include beryllium oxide, aluminum nitride, silicon carbide, or a polymer composite material with high thermal conductivity. When a plurality of the conductive areas CA is provided, a portion thereof may be the electrically conductive area, and the remaining portion thereof may be the thermally conductive area.

The pore area PA, an area in which the pore 121 is empty, is formed to surround the conductive area CA around the conductive area CA to isolate the conductive area CA from the surroundings. The pore area PA is made of the anodized film and has an insulation function, as well as a function of electrically and thermally isolating the conductive area CA through the insulation function of the pore 121.

The conductive area CA may include the vertical conductive part 130 formed in the anodized film substrate base 120 while penetrating the anodized film substrate base 120.

According to a preferred embodiment of the present invention, the vertical conductive part 130 of the anodized film substrate 110 may have any shape. Since the through hole 125 of the anodized film substrate base 120 is formed through the etching process, cross-sectional shapes of the through hole 125 may be a circular shape as well as a polygonal shape, such as a quadrangle, a triangle, or a hexagon, as illustrated in FIG. 3B. The circular cross-section is more advantageous than other shapes in terms of crack prevention of the anodized film since the vertical conductive part 130 applies equivalent stress to the surrounding anodized film during thermal expansion. On the other hand, when the plurality of the vertical conductive parts 130 are spaced at the same pitch, a hexagonal cross-section or a quadrangular cross-section has a larger cross-section than the circular cross-section. Therefore, electrical conductivity and/or thermal conductivity are more advantageous than those of the circular cross-section.

Figure 4A:
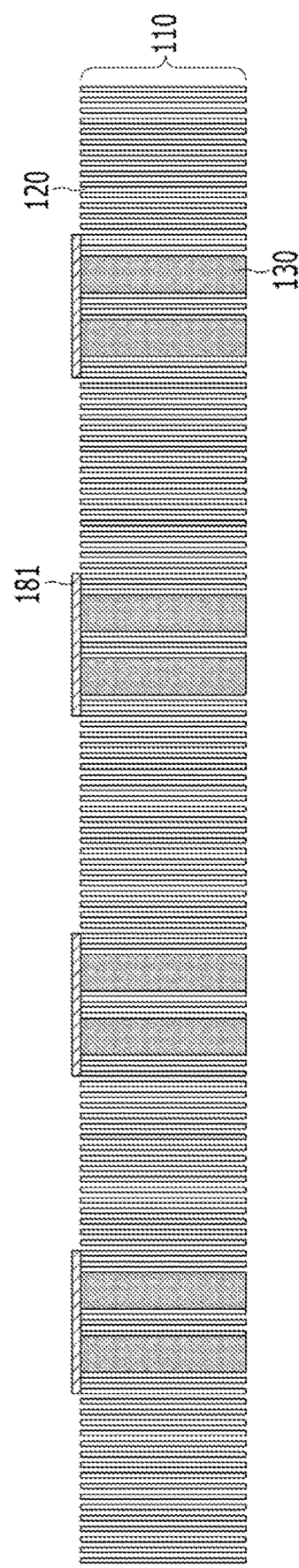
FIG. 4A is a cross-sectional view illustrating an anodized film substrate according to a preferred embodiment of the present invention.
Figure 4B:
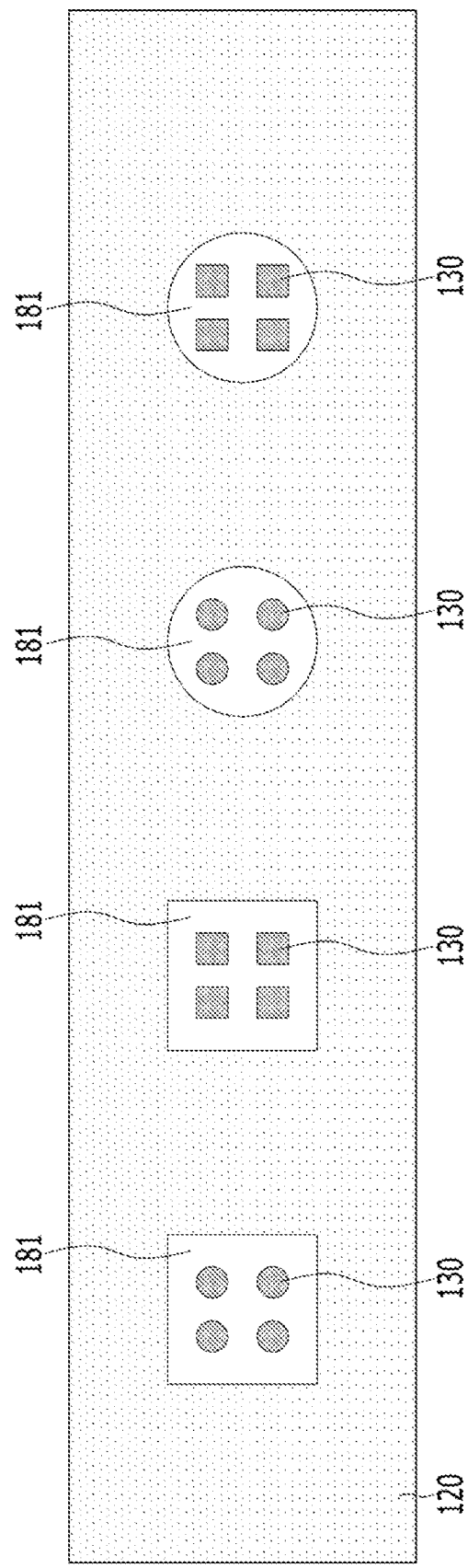
FIG. 4B is a plan view illustrating an anodized film substrate according to a preferred embodiment of the present invention, in which a via-connection pad is transparently processed.

FIG. 4A is a cross-sectional view illustrating an anodized film substrate according to a preferred embodiment of the present invention, and FIG. 4B is a plan view illustrating an anodized film substrate according to a preferred embodiment of the present invention, in which a via-connection pad is transparently processed.

Referring to FIGS. 4A and 4B, the anodized film substrate 110, according to a preferred embodiment of the present invention, includes the via-connection pad 181 formed on the anodized film substrate base 120 while being in contact with the vertical conductive part 130, in which one the via-connection pads 181 may be connected to the plurality of the vertical conductive parts 130.

One of the via-connection pads 181 may be in contact with the plurality of the vertical conductive parts 130 corresponding thereto. An area of one of the via-connection pads 181 is greater than the sum of the areas of the plurality of the vertical conductive parts 130 corresponding thereto.

The vertical conductive part 130 may thermally expand and/or contract during the post-process, such as a reflow process, a thermal compression bonding (TCB) process, or the like. In this case, one of the via-connection pads 181 is in contact with the plurality of the vertical conductive parts 130 corresponding thereto, so that a volume of the vertical conductive part 130 capable of being expanded and/or contracted may be reduced. Unlike the configuration in which one of the vertical conductive parts 130 having a first cross-sectional area is provided in contact with one of the via-connection pads 181 corresponding thereto, according to the configuration in which the plurality of the vertical conductive parts 130 having a second cross-sectional area smaller than the first cross-sectional area is provided corresponding to one of the via-connection pads 181, the amount of volume expansion according to temperature change is reduced. As a result, exfoliation of a material layer on the vertical conductive part 130 may be prevented due to the thermal expansion of the vertical conductive part 130. According to a preferred embodiment of the present invention, the redistribution part 150 may be provided on the vertical conductive part 130. In this case, the vertical conductive part 130 may be divided into a plurality of parts to reduce each of the cross-sectional areas thereof. As a result, a problem of interlayer exfoliation of the redistribution part 150, caused when copper and the like constituting the vertical conductive part 130 expand due to heat, can be prevented.

Here, cross-sectional shapes of the plurality of the vertical conductive parts may be a circular shape as well as a polygonal shape, such as a quadrangle, a triangle, or a hexagon, and are not limited. In addition, a horizontal cross-sectional shape of the vertical conductive part 130 and a horizontal cross-sectional shape of the via-connection pad 181 may correspond to each other. As one example, when the via-connection pad 181 has a square horizontal cross-section, the vertical conductive part 130 may also have a square horizontal cross-section corresponding thereto. However, the horizontal cross-sectional shapes are not limited thereto, and the horizontal cross-sectional shape of the via-connection pad 181 and the horizontal cross-sectional shape of the vertical conductive part 130 may be different.

According to the configuration in which the plurality of the vertical conductive parts 130 are correspondingly in contact with one of the via-connection pads 181, even when any one of the vertical conductive part 130 among the plurality of the vertical conductive parts 130 is insufficiently filled with the conductive material and thus imperfectly performs the function thereof, the remaining vertical conductive parts 130 may perfectly achieve the function.

Figure 5A:
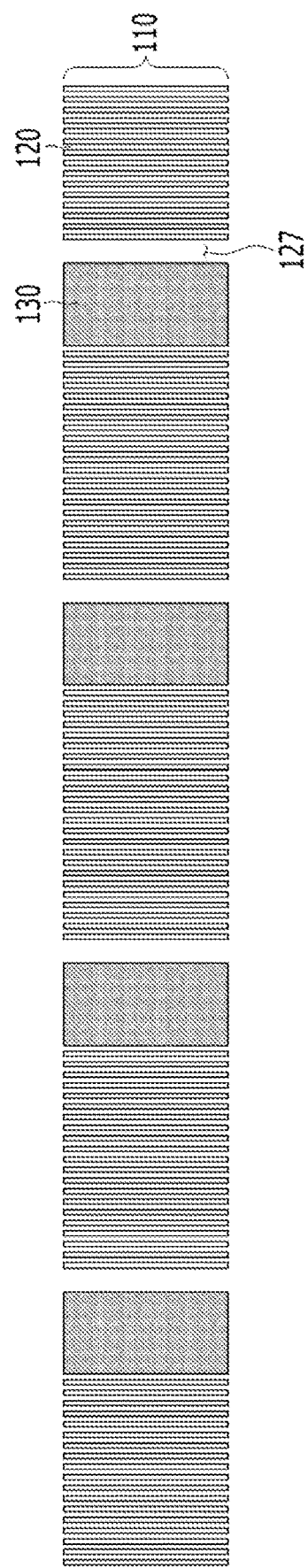
FIG. 5A is a cross-sectional view illustrating an anodized film substrate according to a preferred embodiment of the present invention.
Figure 5B:
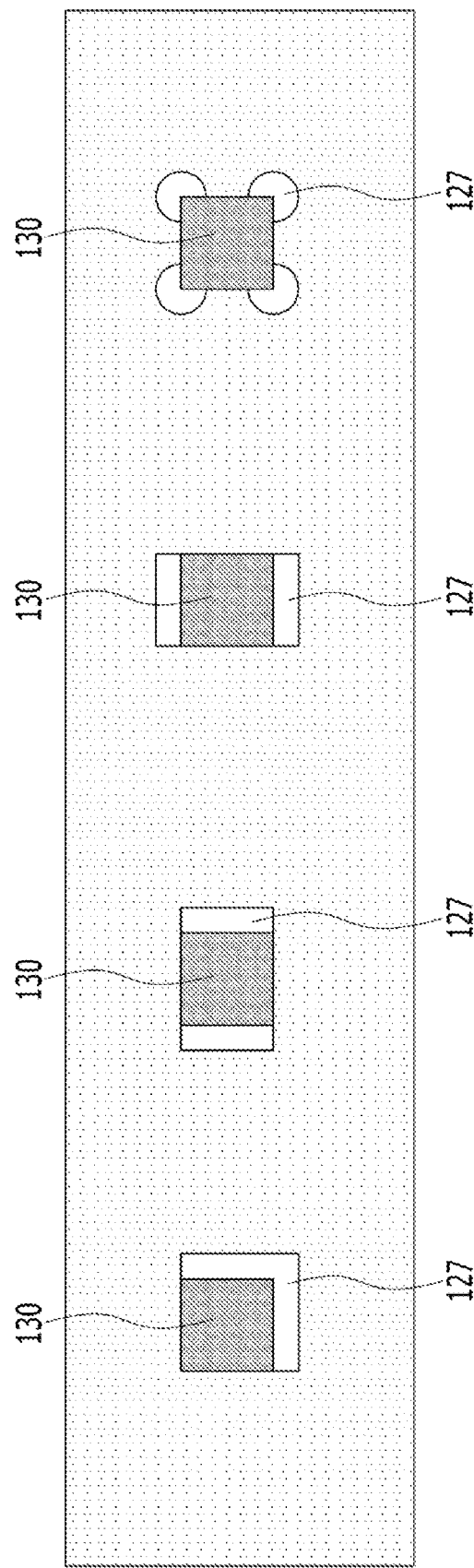
FIG. 5B is a plan view illustrating an anodized film substrate according to a preferred embodiment of the present invention.

FIG. 5A is a cross-sectional view illustrating an anodized film substrate according to a preferred embodiment of the present invention, and FIG. 5B is a plan view illustrating an anodized film substrate according to a preferred embodiment of the present invention.

Referring to FIGS. 5A and 5B, the anodized film substrate 110, according to a preferred embodiment of the present invention, may include a clearance 127 formed between the through hole 125 and the vertical conductive part 130.

The vertical conductive part 130 may be provided on the inner wall of the through hole 125 with gaps and may include the clearance 127 formed on a space between the vertical conductive part 130 and the through hole 125. With the clearance 127 formed around the periphery of the vertical conductive part 130, the clearance 127 allows deformation of the vertical conductive part 130 in a width direction. As a result, exfoliation of the material layer disposed in a length direction of the vertical conductive part 130 may be prevented. According to a preferred embodiment of the present invention, the upper via-connection pad 181 and a lower via-connection pad 183 may be provided on an upper surface and a lower surface of the vertical conductive part 130, respectively. With the clearance 127 formed between the through hole 125 and the vertical conductive part 130, a problem of interlayer exfoliation of the via-connection pads 181 and 183, caused when copper and the like constituting the vertical conductive part 130 expand due to heat, can be prevented.

The clearance 127 may be formed by first forming the vertical conductive part 130 without voids in the through hole 125 and then additionally etching the periphery of the vertical conductive part 130 as the post-process.

The vertical conductive part 130 may have a polygonal cross-section, and the clearance 127 may be formed adjacent to at least one side of the vertical conductive part 130. Referring to FIG. 5B, the conductive part 130 may have a quadrangular cross-section. In addition, the clearance 127 is either formed adjacent to two sides of the vertical conductive part 130 or formed outside the vertex of the vertical conductive part 130 in an arc shape. However, the shape of the clearance 127, according to a preferred embodiment of the present invention, is not limited to the shape illustrated in FIG. 5B, and may include any structure allowing deformation of the vertical conductive part 130 in a width direction when the vertical conductive part 130 thermally expands. As one example, when the vertical conductive part 130 has a circular cross-section, the clearance 127 may be provided in any shape by forming a space around the periphery of the vertical conductive part 130.

Figure 6A:
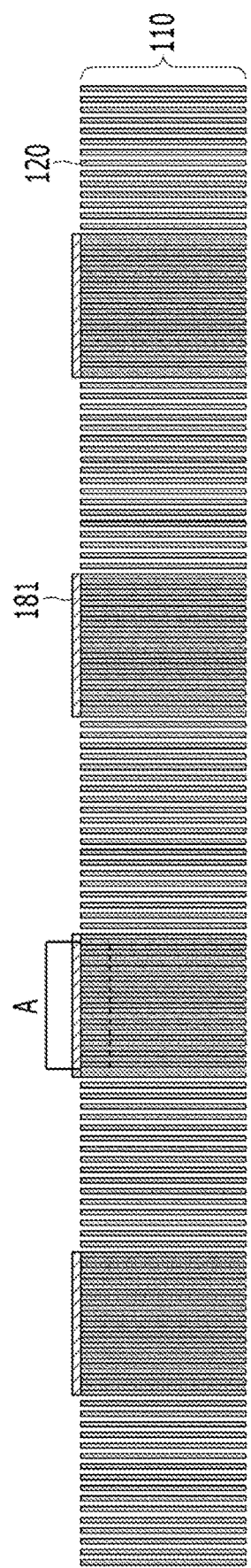
FIG. 6A is a cross-sectional view illustrating an anodized film substrate according to a preferred embodiment of the present invention.
Figure 6B:
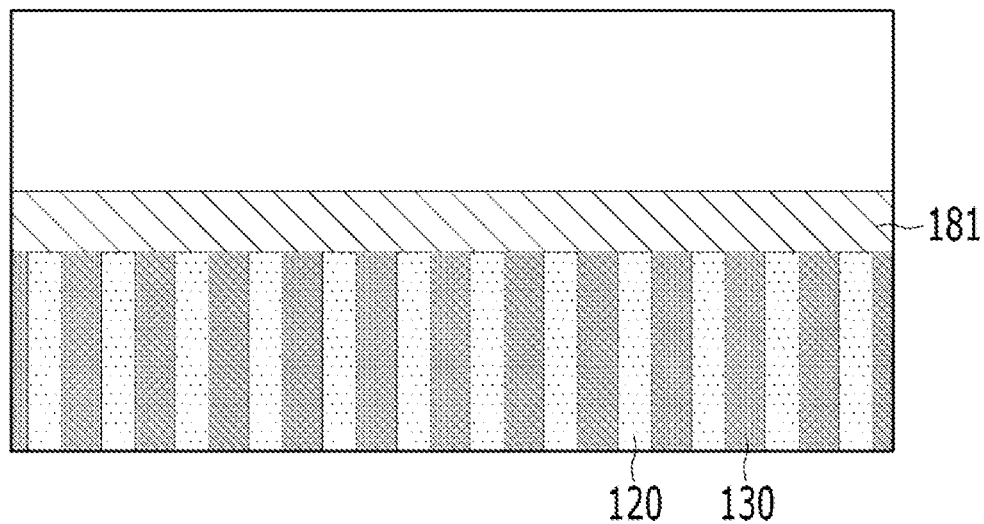
FIG. 6B is an enlarged view illustrating a structure of one embodiment in a portion of FIG. 6A.
Figure 6C:
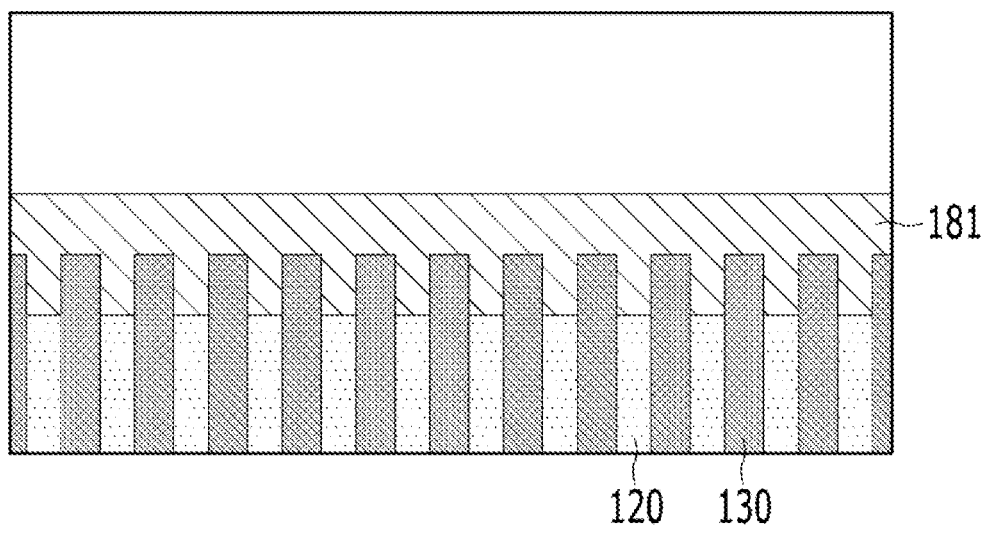
FIG. 6C is an enlarged view illustrating a structure of one embodiment in a portion of FIG. 6A.

FIG. 6A is a cross-sectional view illustrating an anodized film substrate according to a preferred embodiment of the present invention, FIG. 6B is an enlarged view illustrating a structure of one embodiment in a portion of FIG. 6A, and FIG. 6C is an enlarged view illustrating a structure of one embodiment in a portion of FIG. 6A.

Referring to FIGS. 6A to 6C, the anodized film substrate 110, according to a preferred embodiment of the present invention, may include a vertical conductive part 130 formed by filling the pore 121, formed during the anodizing, with a conductive material. Here, the conductive material may include copper, tungsten, aluminum, gold, silver, molybdenum, tantalum, solder, or indium.

The structure of one embodiment in which the through hole 125, formed separately from the pore 121 formed during the anodizing, is formed to be filled with the conductive material is different in that the vertical conductive part 130 illustrated in FIGS. 6A to 6C is formed by filling the pore 121 formed during the anodizing with the conductive material. The configuration in which the vertical conductive part 130 is formed by filling the pore 121, formed during the anodizing, with the conductive material, can significantly reduce the volume of the vertical conductive part 130 capable of being expanded. Thus, the exfoliation of the via-connection pad 181 disposed on the vertical conductive part 130 caused by the thermal expansion of the vertical conductive part 130 can be further effectively prevented.

Referring to FIGS. 6B and 6C, the vertical conductive part 130 may have a structure in which the vertical conductive part 130, formed by filling the pore 121 with the conductive material, does not protrude toward an upper surface of the anodized film substrate base 120 (FIG. 6B), or may have a structure in which the vertical conductive part 130, formed by filling the pore 121 with the conductive material, protrudes toward an upper surface of the anodized film substrate base 120 (FIG. 6C). Here, according to the structure in which the vertical conductive part 130, formed by filling the pore 121 with the conductive material, protrudes toward the upper surface of the anodized film substrate base 120 as illustrated in FIG. 6C, a contact area between the vertical conductive part 130 and the via-connection pad 181 becomes large, so the exfoliation of the via-connection pad 181 can be further effectively prevented.

According to a preferred embodiment of the present invention, the vertical conductive part 130 of the anodized film substrate 110 may include a main conductive part 131 and a buffer part 135 being in contact with the main conductive part 131. The buffer part 135 may be provided on at least a portion of the inside and outside of the main conductive part 131.

Figure 7A:
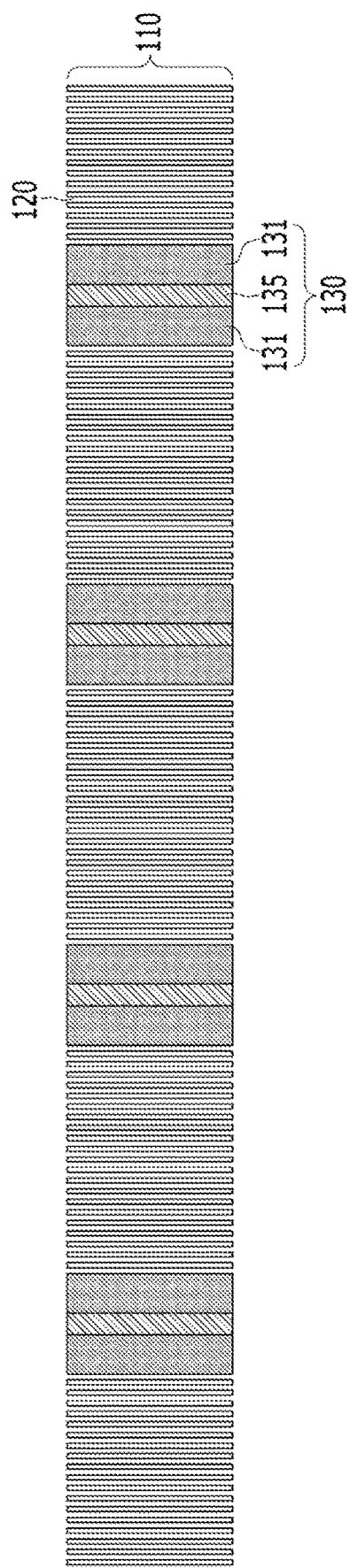
FIG. 7A is a cross-sectional view illustrating an anodized film substrate according to a preferred embodiment of the present invention.
Figure 7B:
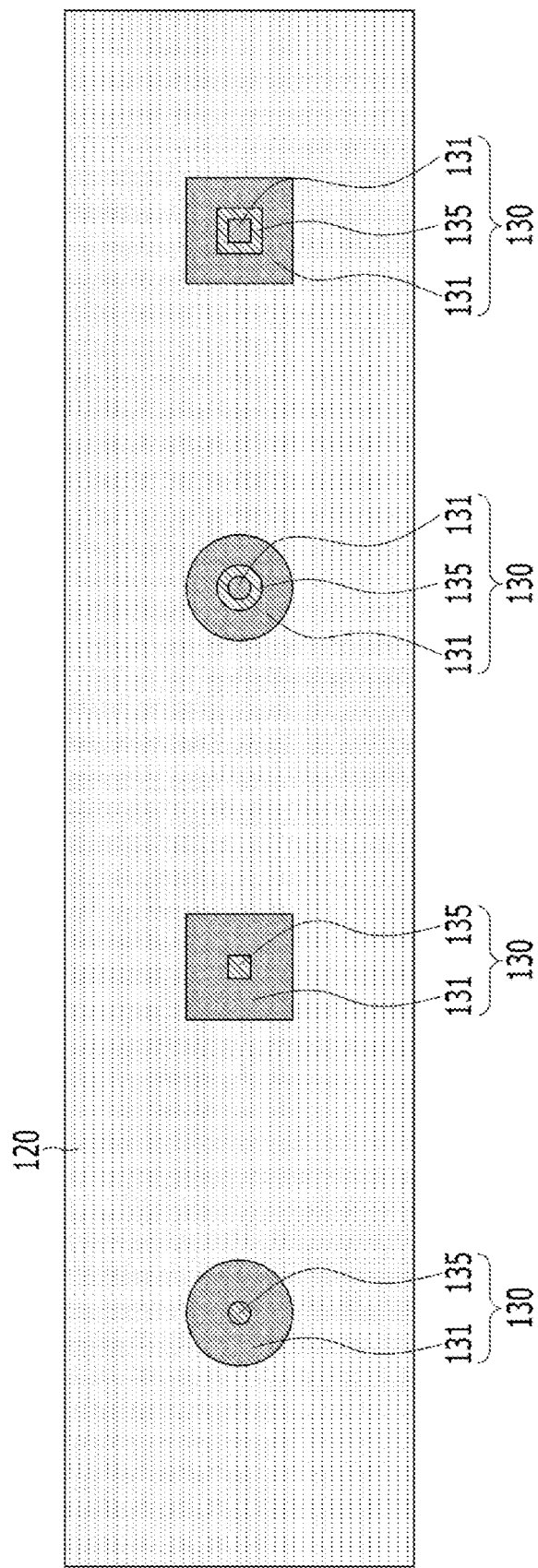
FIG. 7B is a plan view illustrating an anodized film substrate according to a preferred embodiment of the present invention.

FIG. 7A is a cross-sectional view illustrating an anodized film substrate according to a preferred embodiment of the present invention, and FIG. 7B is a plan view illustrating an anodized film substrate according to a preferred embodiment of the present invention.

The vertical conductive part 130 illustrated in FIGS. 7A and 7B includes the buffer part 135 in the main conductive part 131. The buffer part may be made of a metal or non-metal. A material forming the buffer part 135 is preferably a material having a lower elastic modulus than the main conductive part 131. As one example, when the main conductive part 131 is made of copper, the buffer part 135 may be made of solder. Alternatively, the buffer part may be made of a polymer.

Referring to FIG. 7B, the buffer part 135 may have the same cross-sectional shape as the main conductive 131. Through the configuration, the stress of the main conductive part 131 may be uniformly distributed and absorbed by the buffer part 135. On the other hand, the buffer part 135 may be provided between the main conductive parts 131 spaced from each other. In this case, the buffer part 135 may be provided in the form of a tube.

Figure 8:
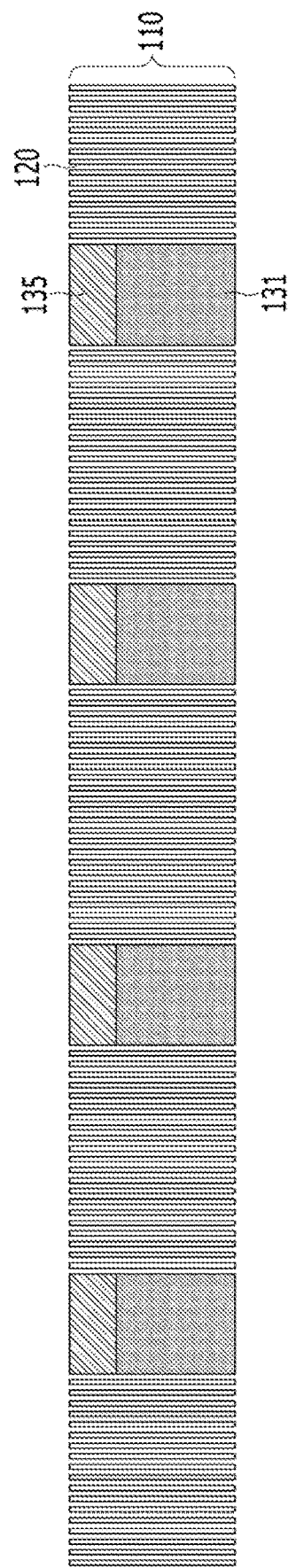
FIG. 8 is a cross-sectional view illustrating an anodized film substrate according to a preferred embodiment of the present invention.

FIG. 8 is a cross-sectional view illustrating an anodized film substrate according to a preferred embodiment of the present invention. Referring to FIG. 8, the vertical conductive part 130 includes the main conductive part 131 and the buffer part 135 provided on at least one surface of the main conductive part 131. The buffer part 135 may be provided on an upper surface and/or a lower surface of the main conductive part 131. In this case, the buffer part 135 may be formed of a metal, which preferably has a lower elastic modulus than the main conductive part 131. For example, the buffer part 135 may be made of solder when the main conductive part 131 is made of copper.

Figure 9:
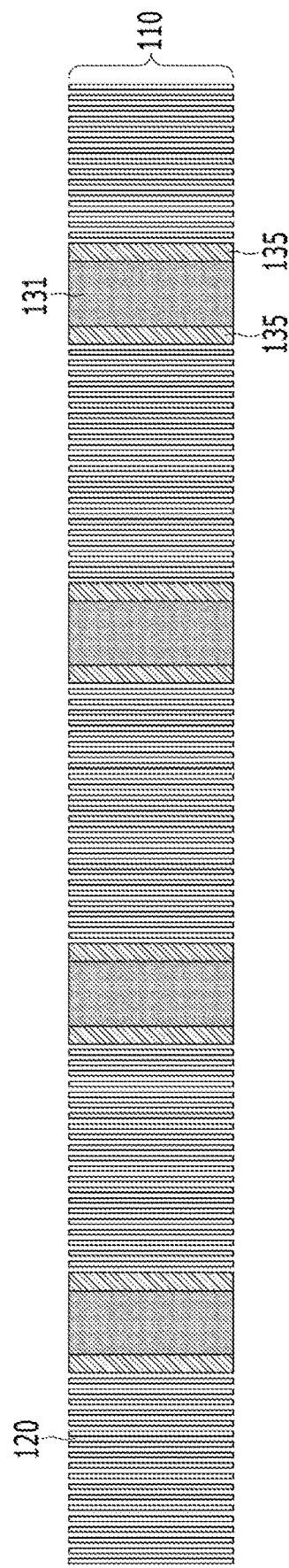
FIG. 9 is a cross-sectional view illustrating an anodized film substrate according to a preferred embodiment of the present invention.

FIG. 9 is a cross-sectional view illustrating an anodized film substrate according to a preferred embodiment of the present invention. Referring to FIG. 9, the vertical conductive part 130 includes the buffer part 135 outside the main conductive part 131. The buffer part 135 is provided between the main conductive part 131 and the anodized film substrate base 120. Here, the buffer part may be made of a metal or non-metal. A material forming the buffer part 135 is preferably a material having a lower elastic modulus than the main conductive part 131. As one example, the buffer part 135 may be made of solder when the main conductive part 131 is made of copper. Alternatively, the buffer part may be made of a polymer.

As the vertical conductive part 130, according to a preferred embodiment of the present invention, has a configuration including the main conductive part 131 and the buffer part 135, the buffer part 135 elastically deforms even when the main conductive part 135 thermally expands due to a temperature change. With the buffer part 135 absorbing the stress caused by the thermal expansion of the main conductive part 131, the exfoliation of the main conductive part 131 from the inner wall of the through hole 125 can be prevented, and the exfoliation of the via-connection pad 181 disposed on an upper portion and/or a lower portion of the vertical conductive part 130 can be prevented.

According to a preferred embodiment of the present invention, the anodized film substrate base 120 of the anodized film substrate 110 may include the barrier layer 129 formed on at least one surface side of the anodized film substrate base during the anodizing to seal one end of the pore, or may have a structure in which the pore 121 is unsealed by removing the barrier layer 129 formed on the at least one surface side of the anodized film substrate base during the anodizing.

Figure 10B:
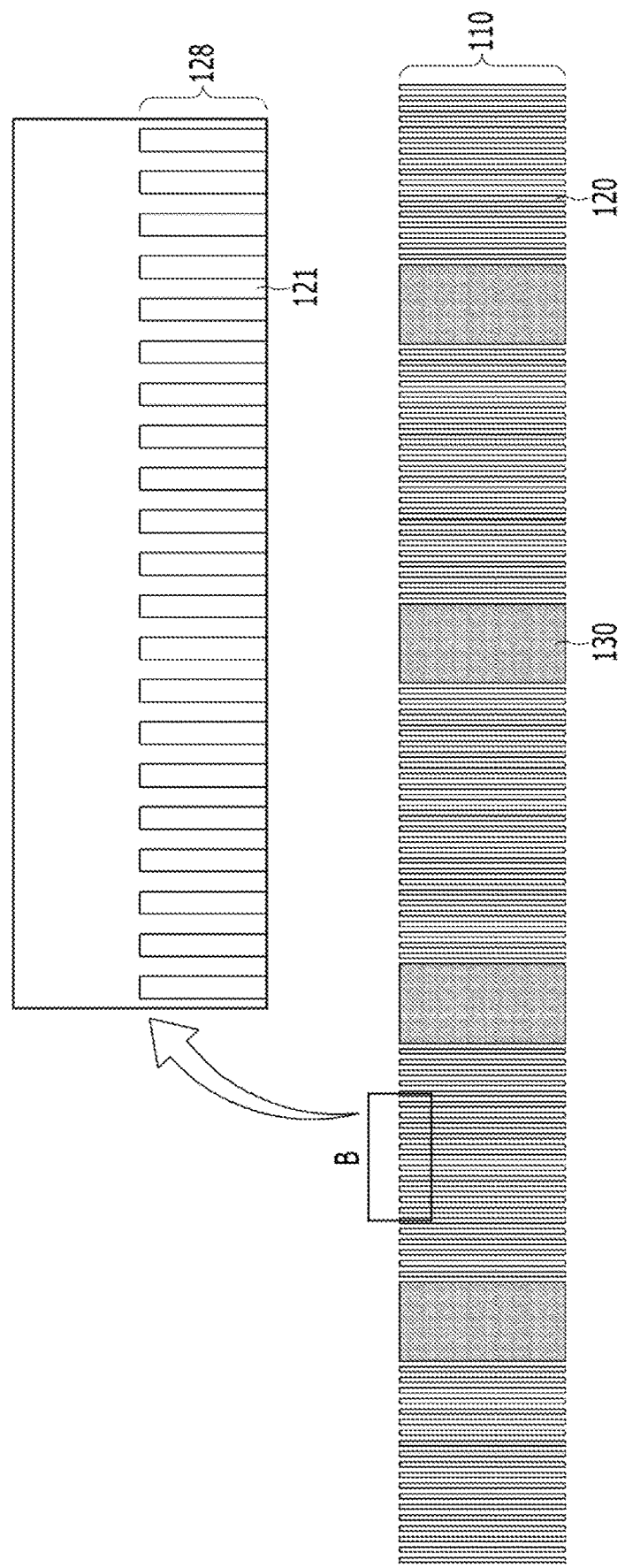
FIG. 10B is a plan view illustrating an anodized film substrate according to a preferred embodiment of the present invention.

FIG. 10A is a cross-sectional view illustrating an anodized film substrate according to a preferred embodiment of the present invention, and FIG. 10B is a plan view illustrating an anodized film substrate according to a preferred embodiment of the present invention.

Referring to FIG. 10A, the anodized film substrate base 120 has a structure in which the barrier layer 129 is formed on the at least one surface side of the anodized film substrate base during the anodizing to seal one end of the pore 121. The redistribution part 150 may be formed on an upper surface of the barrier layer 129. According to the structure in which the barrier layer 129 is provided on under the redistribution part 150, there is an advantage in that the flatness of the redistribution part 150 can be improved when forming the redistribution part 150 on the barrier layer 129. Therefore, a planarization process of the redistribution part 150 can be omitted. In addition, due to the structure in which the pore 121 is sealed, the influence on the post-process can be prevented by outgassing fine particles during the post-process after the fine particles are attached to the pore 121.

Referring to FIG. 10B, the anodized substrate base 120 has a structure in which the pore 121 is unsealed on the surface side. According to the configuration in which the redistribution part 150 is formed on the surface where the pore 121 is unsealed, the pore 121 unsealed on the upper portion has an effect of preventing the exfoliation of the redistribution part 150 formed thereon. More specifically, the redistribution part 150 is formed on the anodized film substrate base 120, and at least a portion of the redistribution part 150 is infiltrated into the pore 121 and anchored, so the exfoliation of the redistribution part 150 can be further effectively prevented.

Figure 11:
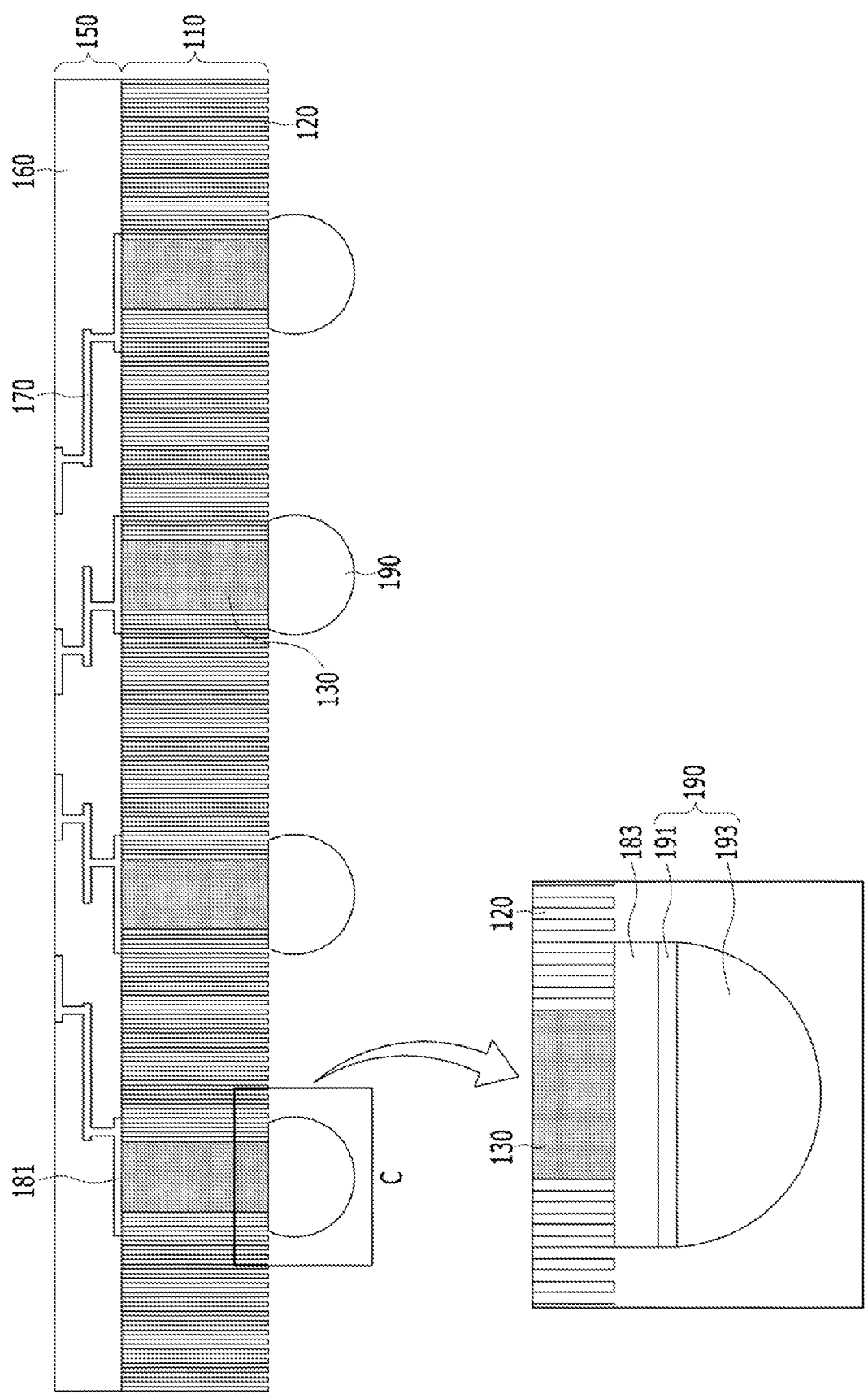
FIG. 11 is a cross-sectional view illustrating an anodized film-based interposer according to a preferred embodiment of the present invention.

According to a preferred embodiment of the present invention, the anodized film substrate 110 may include an external connection terminal 190. FIG. 11 is a cross-sectional view illustrating an anodized film-based interposer according to a preferred embodiment of the present invention. Referring to FIG. 11, the lower via-connection pad 183 connected to the vertical conductive part 130, an under bump metallurgy (UBM) 191 formed on a lower surface of the lower via-connection pad 183, and a solder bump 193 formed on a lower surface of UBM are provided under the anodized film substrate 110. The lower via-connection pad 183 may be made of the same material as the vertical conductive part 130. UBM 191 may include one or a plurality of non-solder metal layers. For example, UBM 191 may include a copper-containing layer including copper or a copper alloy, and may also include a metal capping layer on the copper-containing layer. The metal capping layer may be a nickel-containing layer, a palladium-containing layer, and/or the like, or the multi-layers thereof. The solder bump 193 may be formed of an Sn—Ag alloy, an Sn—Ag—Cu alloy, or the like, and may or may not contain lead.

The anodized film substrate base 120 may include a depression 123. The depression 123 may be formed by removing at least a portion of the anodized film substrate base 120. The depression is preferably formed on a surface of the anodized film substrate base 120 on which the redistribution 150 is not formed. In the post-process, the redistribution part 150 is formed on a first surface of the anodized film substrate base 120 to mount the semiconductor chip 10, and the external connection terminals 190 are formed on a second surface of the anodized film substrate base 120 by inverting the anodized film substrate base 120. Then, since a singulation process is performed while the second surface faces upward, a structure in which the depression 123 is formed on the second surface less interferes with the process of forming the external connection terminal 190. In addition, since the singulation process is performed on the second surface side by singulation means, the anodized film substrate base 120 can be further easily diced.

Figure 12A:
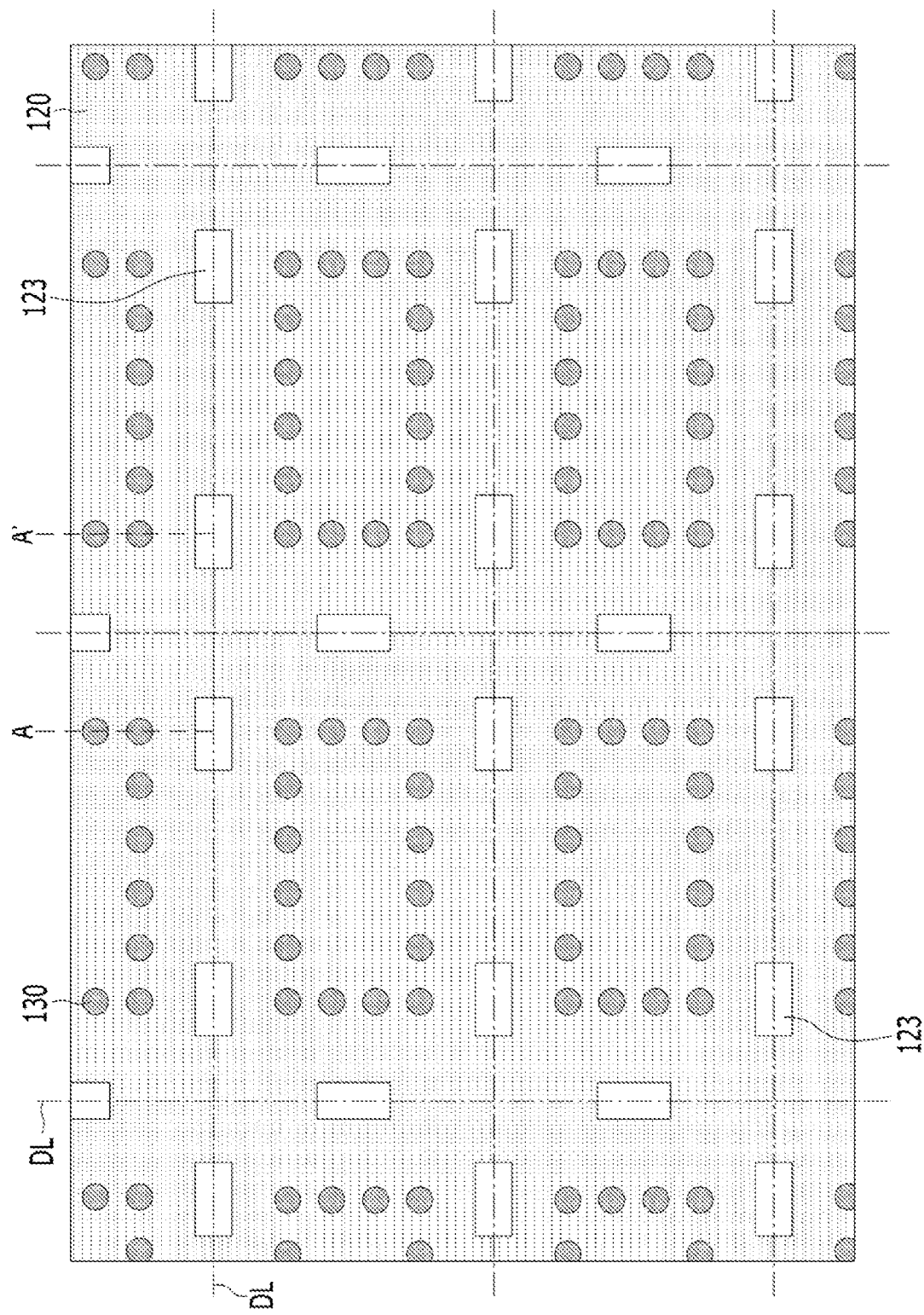
FIG. 12A is a plan view illustrating an anodized film substrate according to a preferred embodiment of the present invention.
Figure 12B:
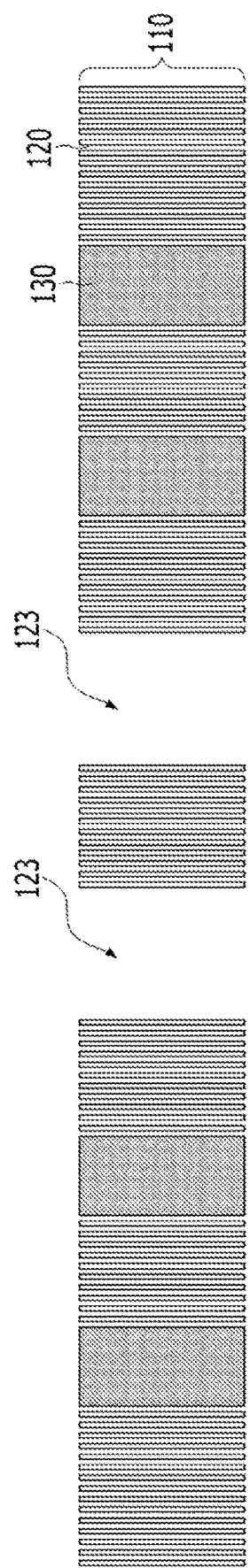
FIG. 12B is a view illustrating a structure of one embodiment of the cross-sectional view along A-A' line of FIG. 12A.
Figure 12C:
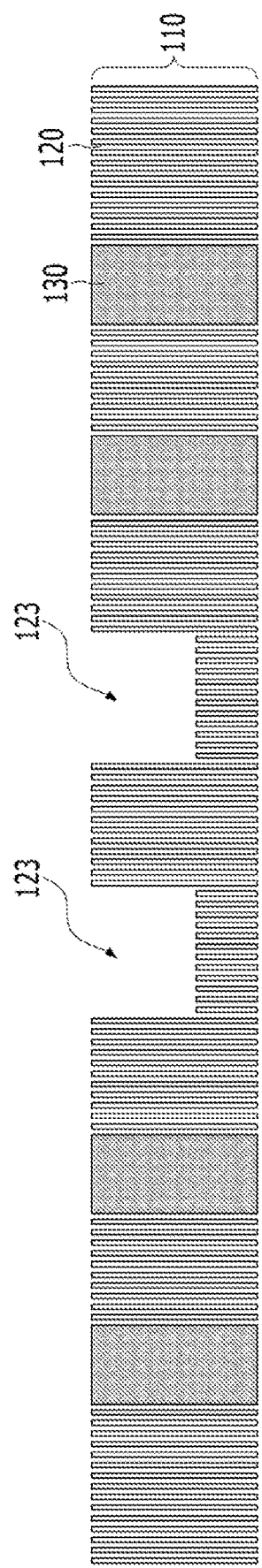
FIG. 12C is a view illustrating a structure of one embodiment of the cross-sectional view along A-A' line in FIG. 12A.
Figure 12D:
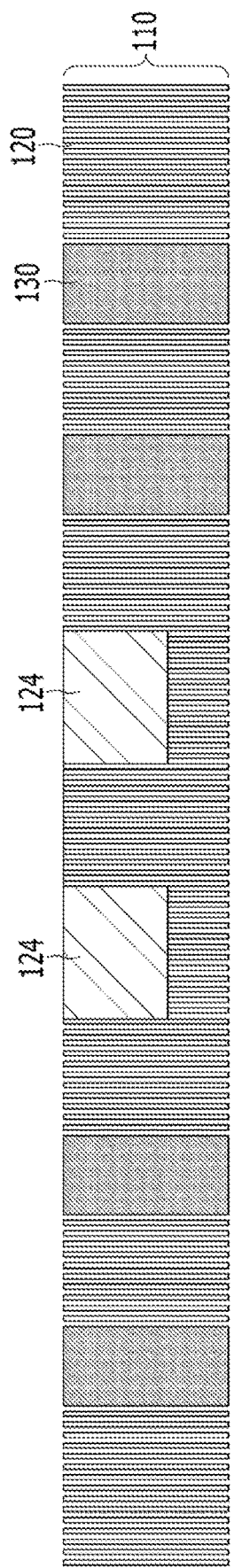
FIG. 12D is a view illustrating a structure of one embodiment of the cross-sectional view along A-A' line in FIG. 12A.
Figure 12E:
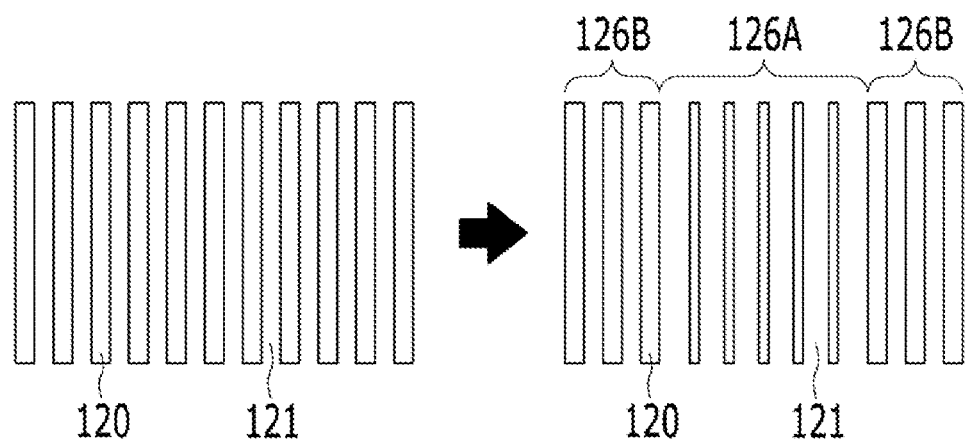
FIG. 12E is a view illustrating a structure of one embodiment of the cross-sectional view along A-A' line in FIG. 12A.
Figure 13:
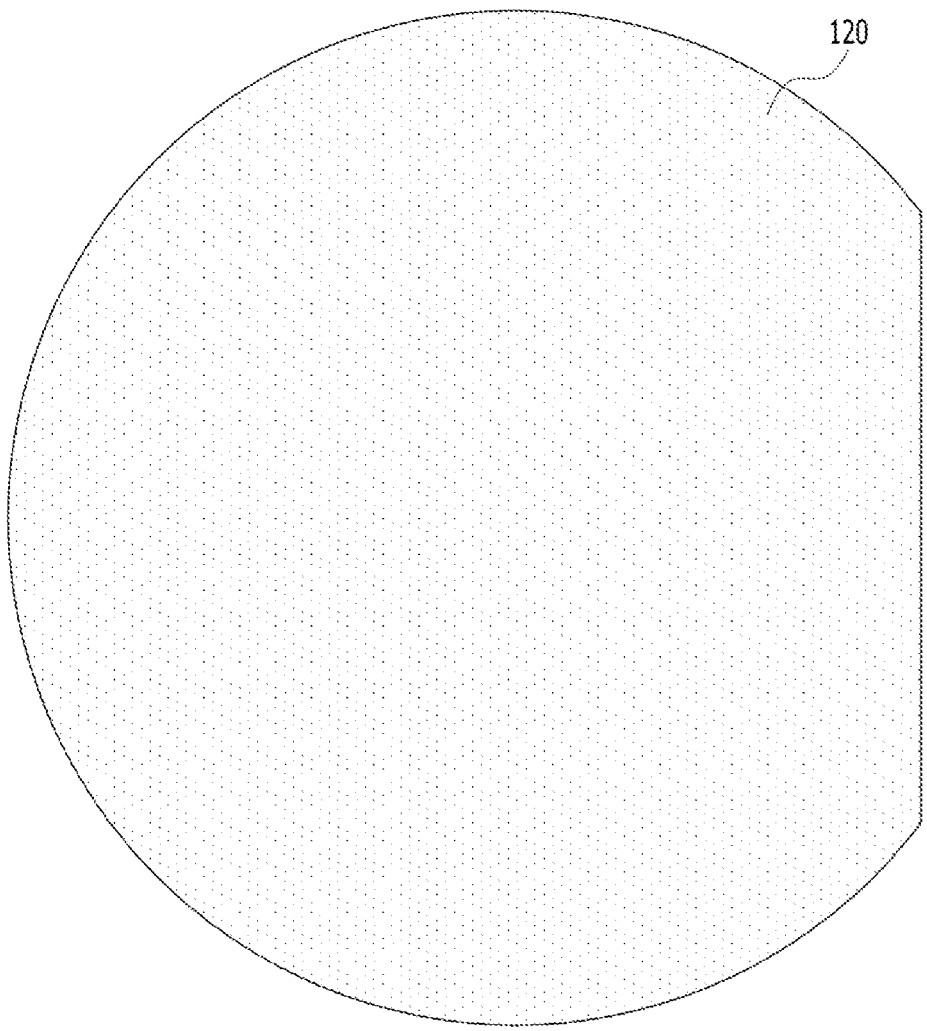
FIGS. 13 to 25 are cross-sectional views sequentially illustrating a method of manufacturing a semiconductor package according to one embodiment of the present invention.

FIG. 12A is a plan view illustrating an anodized film substrate according to a preferred embodiment of the present invention, FIG. 12B is a view illustrating a structure of one embodiment of the cross-sectional view along A-A' line of FIG. 12A, FIG. 12C is a view illustrating a structure of one embodiment of the cross-sectional view along A-A' line in FIG. 12A, FIG. 12D is a view illustrating a structure of one embodiment of the cross-sectional view along A-A' line in FIG. 12A, and FIG. 12E is a view illustrating a structure of one embodiment of the cross-sectional view along A-A' line in FIG. 12A.

The depression 123 may be formed such that at least a portion of the anodized film substrate base 120 is excavated. In this case, when the excavated portion is in a vertical direction of the anodized film substrate base 120, the depression 123 may be in the form of a hole or a groove. In addition, when the excavated portion is in a horizontal direction in the pore 121, the depression 123 may be in the form of a reamed hole.

The anodized film substrate base 120 may be formed in a size and shape corresponding to those of a wafer. An anodized film substrate base 120 formed in the size and shape corresponding to those of the wafer is referred to as an anodized oxide film substrate base of an original plate 120, and an anodized film substrate base 120 being diced and singulated in the post-process is referred to as a unit anodized oxide film substrate base 120. When the anodized film substrate base of the original plate 120 is diced into the further small-sized unit anodized film substrate base 120, the depression 123 may be provided at a position along a dicing line DL. When the depression 123 is formed on the anodized film substrate base 120 along the dicing line DL, dicing of the anodized film substrate base 120 along the dicing line DL can be rather easily performed. Through the configuration, damage to the anodized film substrate base 120 can be prevented when singulating the anodized film substrate base of the original plate 120 into the unit anodized film substrate base 120.

Referring to FIG. 12A, the depression 123 is formed on the anodized film substrate base 120 along the dicing line DL. At least one of the depressions 123 may be provided along the dicing line DL. Through the configuration, when dicing along the dicing line DL, the anodized film substrate base 120 can be rather easily diced. In addition, burr formation is minimized during the dicing, and the stress generated during the dicing can be prevented from being transmitted to the anodized film substrate base 120. The anodized film substrate base 120 is made of a material prone to brittle fracture, so concern about brittle fracture can be minimized through the configuration in which the depression 123 is formed along the dicing line DL.

Referring to FIG. 12B, the depression 123 may be provided in the form of a hole vertically penetrating the anodized film substrate base 120. Referring to FIG. 12C, the depression 123 may be provided in the form of a groove excavated only to a predetermined depth.

On the other hand, referring to FIG. 12E, the depression 123 may be provided in the form of a reamed portion 126A formed by expanding a diameter of the pore 121. When anodizing the base metal, a plurality of the pores 121 are regularly formed. The reamed portion 126A is formed by expanding the pore of the pore group 121 disposed on a partial area of such pore 121 (for example, the dicing line DL).

The anodized film substrate base 120 is formed of the reamed portion 126A in which the pore of the pore group 121 formed during the anodizing are reamed and a non-reamed portion 126B in which the pore of the pore group 121 formed during the anodizing are maintained. Through the configuration of the reamed portion 126A, the anodized film substrate base 120 can be rather easily diced.

Referring to FIG. 12D, a filler 124 is provided in the depression 123. Even though FIG. 12D illustrates the filler 124 as being provided in a structure of the depression 123 illustrated in FIG. 12C, the filler 124 may be provided in a structure of the depression 123 illustrated in FIG. 12B. In addition, the reamed portion 126A illustrated in FIG. 12E may be filled with the filler 124.

The filler 124 may be made of a metal or non-metal. Depending on the material of the filler 124, the function of the depression 123 or the anodized film substrate base 120 can be reinforced. Depending on the material of the filler 124, the filler 124 may perform a function of radiating het and may minimize burr formation during the dicing. In addition, the filler 124 may perform a function of reinforcing a side surface of the unit anodized film substrate base 120 after the dicing.

The filler 124 may be employed for the purpose of performing a function of adjusting the coefficient of thermal expansion of the anodized film substrate 110. The filler 124 may adjust the coefficient of thermal expansion of the anodized film substrate 110 to prevent damage to a junction between the semiconductor chip 10 and/or a junction between the package substrate 20.

Referring back to FIG. 1, the semiconductor package 1, according to a preferred embodiment of the present invention, includes the semiconductor chip 10 and the anodized film-based interposer 100 on which the semiconductor chip 10 is mounted.

The anodized film-based interposer 100, according to a preferred embodiment of the present invention, may be composed of the anodized film substrate 110 and the redistribution part 150. The package substrate 20 may be provided under the anodized film-based interposer 100 so that the anodized film-based interposer 100 may be interposed between the semiconductor chip 10 and the package substrate 30. The anodized film-based interposer 100 is interposed between the semiconductor chip 10 and the package substrate 30 to perform a redistribution function and a function of preventing connection defects between the semiconductor chip 10 and the package substrate 30.

When the semiconductor package 1 is manufactured by directly mounting the semiconductor chip 10 on the package substrate 30 made of an organic material and forming a wiring pattern thereon, and by performing soldering or the like, the package substrate 30 and the semiconductor chip 10 are required to be heated to a solder melting temperature. In this case, the package substrate 30 made of organic material has a thermal expansion rate that is significantly different from the thermal expansion rate of the semiconductor chip 10, so cracks may occur at a junction between the package substrate 30 and the semiconductor chip 10. When the package substrate 30 and the semiconductor chip 10 are cooled after the soldering process is completed, the semiconductor chip 10 may be damaged.

However, when the anodized film-based interposer 100, according to a preferred embodiment of the present invention, is interposed between the semiconductor chip 10 and the package substrate 30, the above-mentioned problems caused by a difference in the thermal expansion rate between the package substrate 30 and the semiconductor chip 10 can be solved. The anodized film-based interposer 100, according to a preferred embodiment of the present invention, has a thermal expansion rate ranging between a thermal expansion rate of the semiconductor chip 10 made of silicon and a thermal expansion rate of the package substrate 30 made of organic material. Thus, the stress caused by the difference in the thermal expansion rate between the two can be relieved. Accordingly, cracks occurring at the junction between the package substrate 30 and the semiconductor chip 10 can be prevented, or when the package substrate 30 and the semiconductor chip 10 are cooled after the soldering process is completed, the damage to the semiconductor chip 10 can be prevented.

On the other hand, while an existing silicon-based interposer or glass-based interposer uses silicon or glass as a base material, respectively, there is a compositional difference in that the anodized film-based interposer 100, according to a preferred embodiment of the present invention, is based on the anodized film. Due to the fundamental compositional difference regarding the base material as mentioned above, the anodized film-based interposer 100, according to a preferred embodiment of the present invention, has the following advantages, unlike the existing interposer.

First, an anodized film substrate base 120 itself has insulating properties, so thin film processes required for the silicon-based interposer, in which an insulating film, a diffusion prevention barrier film, and the like are formed, is unnecessary. In addition, given that many through holes 125 are formed at once through the single etching process, expansive laser equipment required for the glass-based interposer is unnecessary.

Second, the through hole 125 formed in the anodized film substrate base 120 has a vertical inner wall, and there is no restriction on the shape of the through hole 125. In the case of the silicon-based interposer, expansive dry etching equipment is required to form vertical through holes. However, in this case, there are problems in that manufacturing costs increase and manufacturing time takes longer. In addition, when using a laser, shapes of via holes are subject to certain constraints.

Third, unlike the silicon-based interposer or glass-based interposer, the anodized film-based interposer 100, according to a preferred embodiment of the present invention, is composed of the plurality of the pores 121 having diameters in a range of several nm to several hundreds of nm in the regions between the vertical conductive parts 130. The plurality of the pores 121 between the vertical conductive parts 130 perform a function of blocking horizontal heat transmission according to a temperature change in the vertical conductive parts 130. The plurality of the pores 121 block heat transmission in the horizontal direction in the anodized film substrate base 120 by exhibiting a function capable of having a plurality of air columns. Typically, a plurality of semiconductor chips can be mounted on an interposer. However, in the case of the silicon-based interposer, via conductors are required to be spaced from each other by 5 μm or more since the heat generated according to the temperature change in the via conductor is transmitted to the peripheral via conductors. However, in the anodized film-based interposer according to a preferred embodiment of the present invention, the heat generated from the vertical conductive parts 130 is blocked from being transmitted to the peripheral vertical conductive parts 130. As a result, the vertical conductive parts 130 can be disposed at further fine-pitch intervals, thereby effectively responding to the miniaturization of the semiconductor chips. Thus, the anodized film-based interposer 100, according to a preferred embodiment of the present invention, can improve the density of the semiconductor chip and minimize peripheral heat transmission, thereby improving the electrical properties and reliability of the semiconductor chip 10.

Fourth, unlike the silicon-based interposer or glass-based interposer, the amount of capacitive coupling component generated by a parasitic capacitor between the vertical conductive parts 130 can be reduced through the configuration in which the plurality of the pores 121 are formed between the vertical conductive parts 130. As a result, the vertical conductive parts 130 can stably transmit signals.

As described above, the anodized film-based interposer 100, according to a preferred embodiment of the present invention, can solve the problems occurring in the existing silicon-based interposer or glass-based interposer, and can significantly reduce manufacturing costs. In addition, the effects enabling stable transmission of signals and miniaturization of semiconductor chips, which are limited to be achieved in the existing silicon material or glass material, can be expressed.

FIGS. 13 to 25 are cross-sectional views sequentially illustrating a method of manufacturing a semiconductor package according to one embodiment of the present invention. Hereinafter, a process of manufacturing the semiconductor package 1, according to a preferred embodiment of the present invention, will be described with reference to FIGS. 13 to 25.

The anodized film substrate base 120 is manufactured through a process in which the base metal, made of aluminum or an aluminum alloy, is anodized. The pore 121 included in the porous layer 128 has a diameter in a range of several nm or more to several hundred nm or less. As described with reference to FIGS. 10A and 10B, the anodized film substrate base 120 formed through the anodizing process may include the barrier layer 129 formed on the at least one surface side of the anodized film substrate base 120 during the anodizing to seal one end of the pore 121. Alternatively, the anodized film substrate base 120 may have a structure in which both ends of the pore 121 are unsealed by removing the barrier layer 129 formed on the at least one surface side of the anodized film substrate base 120 during the anodizing.

Figure 14:
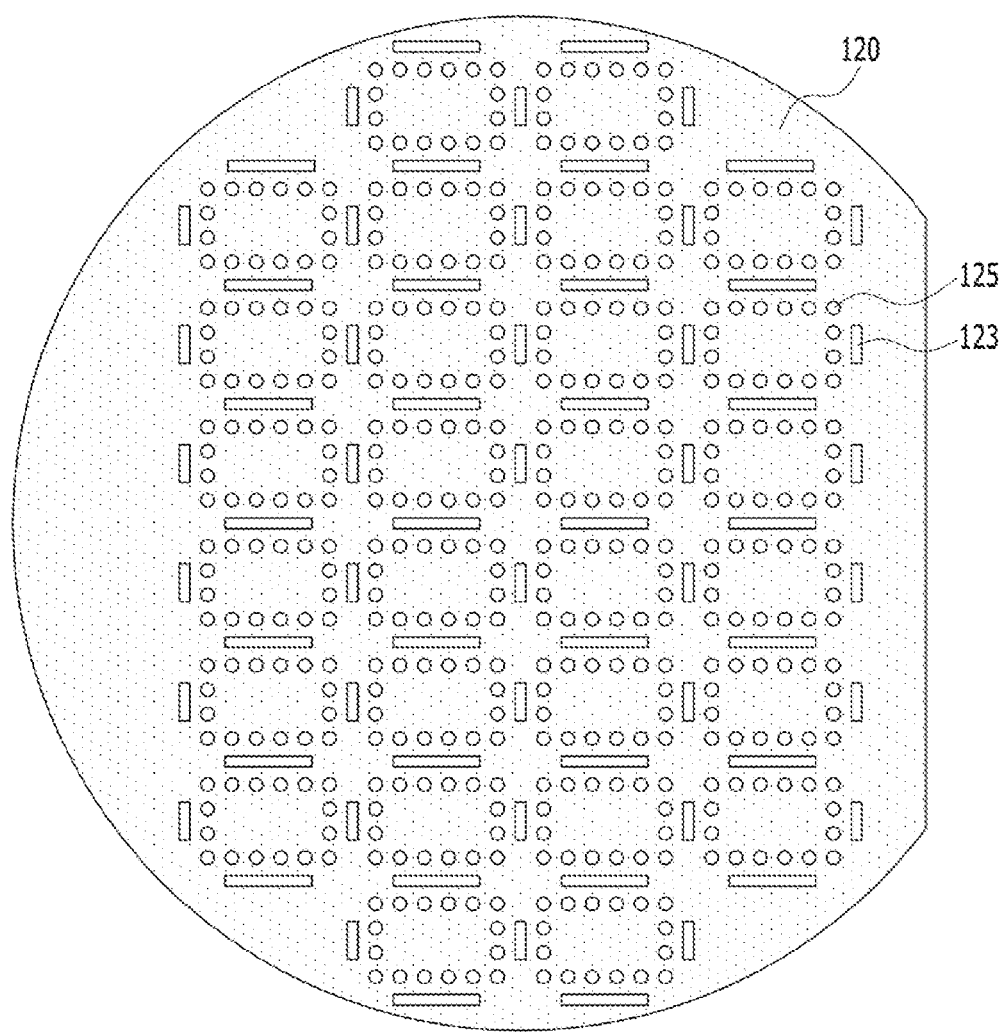

Referring to FIG. 14, the through hole 125 having a larger size than the pore 121 is formed in the anodized film substrate base 120, separately from the pore 121.

The through hole 125 may have a size in a range of several μm or more to several tens of μm or less. The plurality (as an example, in a range of tens of thousands to several million) of the through holes 125 may be formed at once with the single etching process. Therefore, the through hole 125 has advantages in terms of production speed and manufacturing costs compared to an existing process in which one via hole is formed at a time. In addition, the through hole 125 is formed through the etching process, so there is no restriction on the shape of the through hole 125, and the inner wall of the through hole 125 formed by the reaction between the anodized film and the etching solution has a vertical shape. The inside of the through hole 125 having the vertical inner wall is filled with the conductive material to form the vertical conductive part 130, so there is an advantage in that electricity smoothly flows, compared to via conductors incapable of forming a vertical inner wall. The through hole 125 may be formed by forming the photoresist on the upper surface of the anodized film substrate base 120 and patterning the photoresist to form an opening area, and then flowing the etching solution through the opening area. Thus, the through hole 125 is formed to have a cross-sectional shape corresponding to the shape of the patterned opening area. As illustrated in FIGS. 3A and 3B, the cross-sectional shapes of the through hole 125 may be circular shapes as well as polygonal shapes.

In addition, the depression 123 may be formed in the anodized film substrate base 120. The depression 123 may be formed along the dicing line DL in the post-process. As described with reference to FIG. 12, the depression 123 may be formed such that at least the portion of the anodized film substrate base 120 is excavated. When the excavated portion is in the vertical direction of the anodized film substrate base 120, the depression 123 may be provided in the form of a hole or a groove, and when the excavated portion is in the horizontal direction in the pore 121, the depression 123 may be provided in the form of a reamed hole.

When the anodized film substrate base of the original plate 120 is diced into the further small-sized unit anodized film substrate base 120, the depression 123 may be provided at the position along the dicing line DL. When the depression 123 is formed on the anodized film substrate base 120 along the dicing line DL, the dicing of the anodized film substrate base 120 along the dicing line DL can be rather easily performed. Through the configuration, damage to the anodized film substrate base 120 can be prevented when singulating the anodized film substrate base of the original plate 120 into the unit anodized film substrate base 120.

Figure 15:
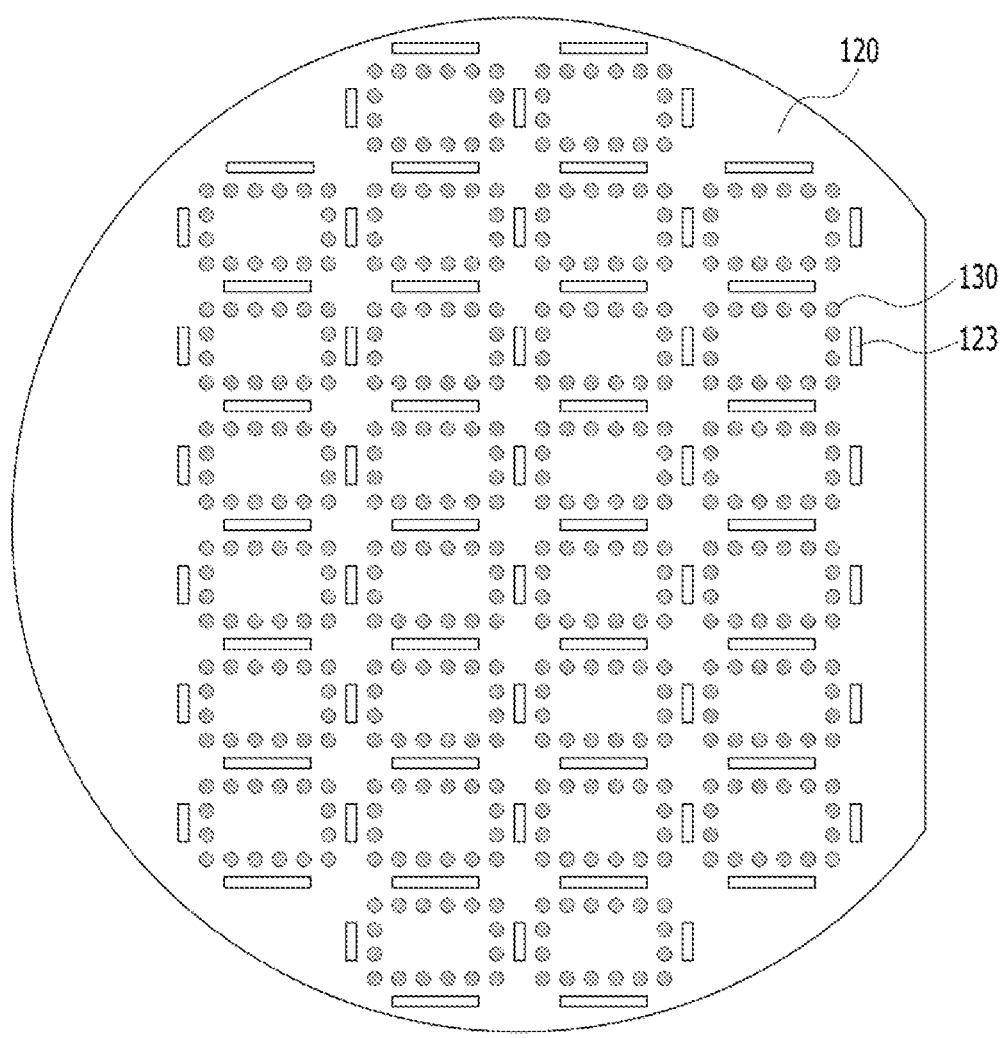
Figure 16:
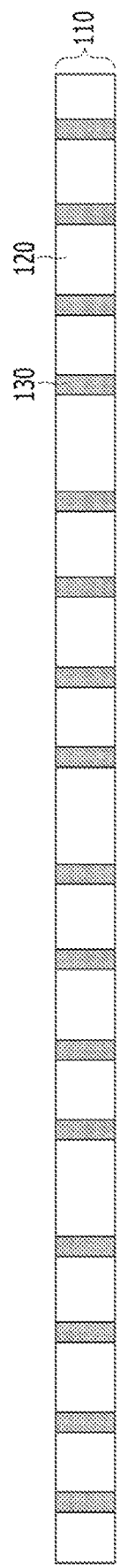

Referring to FIGS. 15 and 16, the vertical conductive part 130 is formed by filling the through hole 125 of the anodized film substrate base 120 with the conductive material.

In this case, the conductive material may include copper, tungsten, aluminum, gold, silver, molybdenum, tantalum, solder, indium, or an alloy thereof. Preferably, the conductive material is copper, which has high electrical conductivity, or a copper alloy. A method of filling the through hole 125 with the conductive material includes electroplating, electroless plating, or selective deposition. Preferably, the inside of the through hole 125 is filled with the conductive material by electroplating. When placing the metal seed substrate under the anodized film substrate base 120 and performing electroplating using the metal seed substrate, the vertical conductive part 130 grows upward in one direction on a lower surface of the seed metal substrate. As a result, the vertical conductive part 130 may be formed in a state in which no voids are generated in the vertical conductive part 130.

As described with reference to FIGS. 3A and 3B, the cross-sectional shapes of the vertical conductive unit 130 may be circular shapes as well as polygonal shapes. In addition, as described with reference to FIGS. 4A and 4B, the vertical conductive part 130 may be formed such that the plurality of the vertical conductive parts 130 are simultaneously connected to one of the via-connection pads 181. In addition, as described with reference to FIGS. 5A and 5B, the additional etching process may be performed to form the clearance 127 around the periphery of the vertical conductive part 130 after forming the vertical conductive part 130. On the other hand, as described with reference to FIGS. 7 to 9, the vertical conductive part 130 may include the main conductive part 131 and the buffer part 135.

When filling the through hole 125 with the conductive material, the depression 123 may be filled with the same material as the conductive material filling the through hole 125, or may be filled with a different material from the material filling the through hole 125. Alternatively, the inside of the depression 123 may be filled with no additional material.

Figure 17:
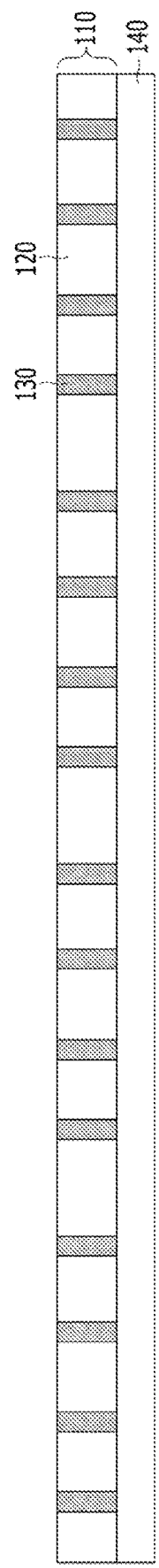

Referring to FIG. 17, the support substrate 140 is provided under the anodized film substrate base 120 to form the anodized film substrate 110.

The support substrate 140 may be formed of silicon, germanium, silicon-germanium, gallium-arsenic (GaAs), glass, plastic, ceramic substrate, and the like. In addition, the support substrate 140 may perform a function of reinforcing the hardness of the anodized film substrate base 120 to facilitate the transportation and/or handling of the anodized film substrate base 120. The support substrate 140 may be attached to the anodized film substrate base 120 due to the adhesive layer. The adhesive layer may be formed by using NCF, ACF, an instant adhesive, a thermosetting adhesive, a laser curing adhesive, an ultrasonic curing adhesive, NCP, or the like.

Figure 26:
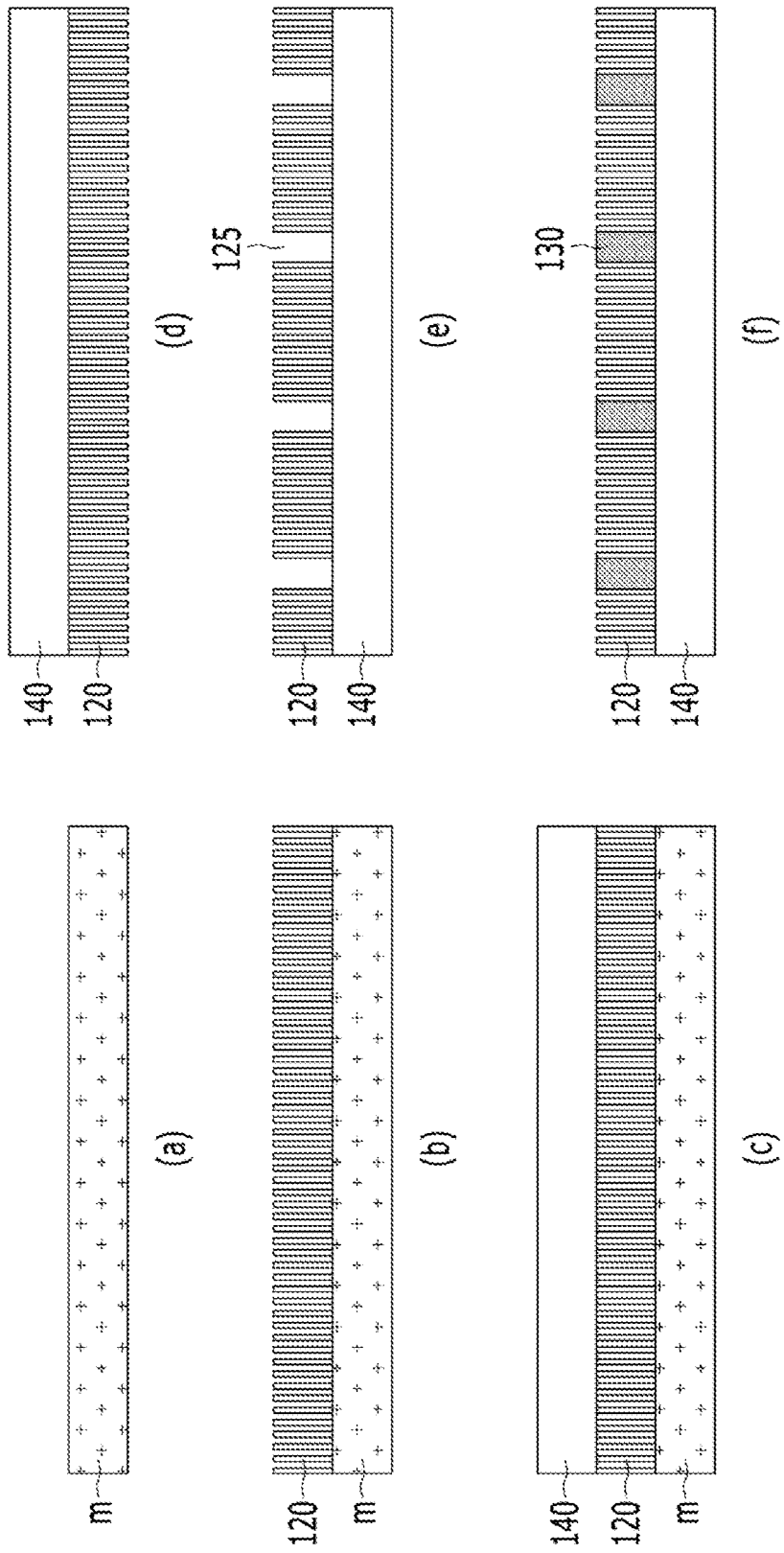
FIG. 26 is a cross-sectional view sequentially illustrating a partial method of manufacturing a semiconductor package according to one embodiment of the present invention.

On the other hand, although the support substrate 140 is described as being provided in the step illustrated in FIG. 17, the support substrate 140 may be provided in a previous step. Referring to FIG. 26, a method of manufacturing a semiconductor package, according to one embodiment of the present invention, includes the following steps: preparing a base metal m (FIG. 26(a)); anodizing the base metal m to form an anodized film substrate base 120 on the base metal m (FIG. 26(b)); providing a support substrate 140 on an upper surface of the anodized film substrate base 120 to dispose the anodized film substrate base 120 between the support substrate 140 and the base metal m (FIG. 26(c)); selectively removing only the base metal m (FIG. 26(d)); forming a through hole 125 in the anodized film substrate base 120 (FIG. 26(e)); and filling the through hole 125 of the anodized film substrate base 120 with a conductive material to form a vertical conductive part 130 (FIG. 26(f). The anodized film substrate base 120 has a thickness in a range of several tens of µm to several hundreds of µm. As a result, brittle fractures may easily occur when only the anodized film substrate base 120 is separately handled. Therefore, the support substrate 140 is required to be provided on one surface of the anodized film substrate base 120 from the process before forming the through hole 125 of the anodized film substrate base 120 to improve the handling of the anodized film substrate base 120. According to a preferred embodiment of the present invention, as illustrated in FIG. 26, the support substrate 140 may be provided on the anodized film substrate base 120 before removing the base metal material m used during the anodizing. In addition, the support substrate 140 may be provided on the anodized film substrate base 120 illustrated in FIGS. 13 to 15.

The following formation steps described with reference to FIGS. 18 to 25 may be a post-process performed based on the step illustrated in FIG. 26(f) or a post-process performed based on the step illustrated in FIG. 17.

Figure 18:
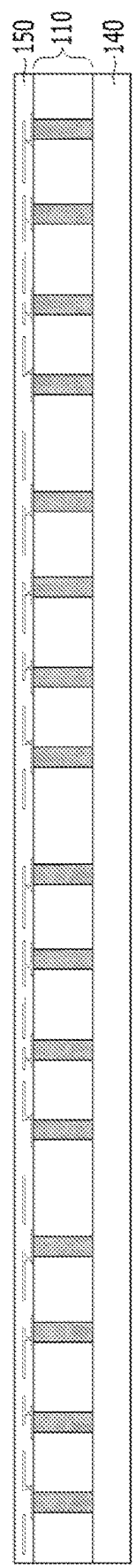

Referring to FIG. 18, the redistribution part 150 is formed on one surface of the anodized film substrate base 120. However, unlike illustrated in FIG. 18, the redistribution part 150 may be provided on both sides of the anodized film substrate base 120.

The redistribution part 150 includes the insulating layer 160 and the wiring pattern 170. The insulating layer 160 may include silicon oxide, silicon nitride, silicon carbide, silicon oxynitride, Low-K dielectric materials such as PSG, BPSG, FSG, SiOxCy, spin-on-glass, and spin-on-polymer, silicon carbon materials, compounds thereof, mixtures thereof, combinations thereof, and the like. The insulating layer 160 may be formed by any suitable conventionally known methods, such as spinning, CVD, PECVD, HDP-CVD, and the like. For example, the wiring pattern 170 may be formed in the insulating layer 160 by forming a photoresist layer on the insulating layer 160 using photolithography and patterning the same so that a portion of the insulating layer 160 to be the wiring pattern 170 is unsealed.

The etching process, such as an anisotropic dry etching process, may be used to form recesses and/or openings in the insulating layer 160 corresponding to the unsealed portions of the insulating layer 160.

The recesses and/or openings may be lined with the diffusion barrier layer (not shown) and filled with the conductive material to constitute the wiring pattern 170. The diffusion barrier layer may include at least one layer made of materials, such as TaN, Ta, TiN, Ti, CoW, and the like formed by ALD and the like. In addition, the conductive material constituting the wiring pattern 170 may include copper, aluminum, tungsten, silver, and combinations thereof, formed by CVD, PVD, and the like. Any excess diffusion barrier layer and/or conductive material on the insulating layer 160 may be removed, for example, by CMP.

Figure 19:
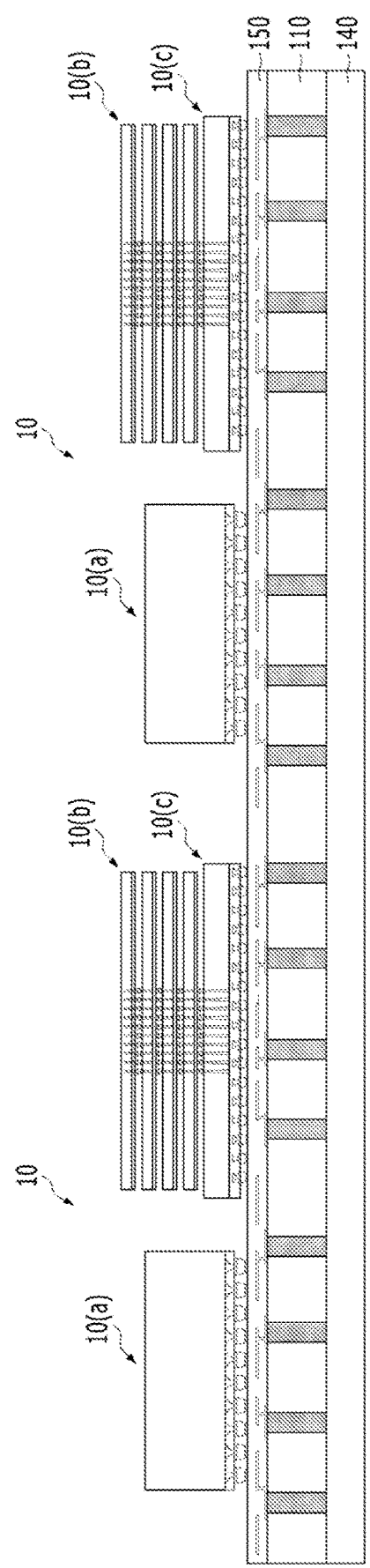

Referring to FIG. 19, the semiconductor chip 10 is mounted on the anodized film-based interposer 100.

A plurality of the semiconductor chips 10 may be mounted, and the first semiconductor chip 10(a) may be a microprocessor (such as a CPU and a GPU). In addition, the second semiconductor chip 10(b) may be a stacked chip in which memories (such as a DRAM, a hybrid memory cube (HMC), a magnetic RAM (MRAM), a phase-change memory (PCM), a resistive RAM (ReRAM), a ferroelectric RAM (FeRAM), and a flash memory (NAND flash)) are stacked in a multilayer structure and connected to each other by TSV. Furthermore, the third semiconductor chip 10(c) may be a logic LSI (such as an ASIC, an FPGA, and an ASSP). A high-temperature process may be required to attach the semiconductor chip 10 to the redistribution part 150 in the anodized film-based interposer 100. While the vertical conductive part 130 also undergoes a temperature change during the high-temperature process, the plurality of the pores 121 block heat transmission between the vertical conductive parts 130. As a result, the exfoliation of the redistribution part 150 caused by the thermal expansion of the vertical conductive part 130 can be minimized.

Figure 20:
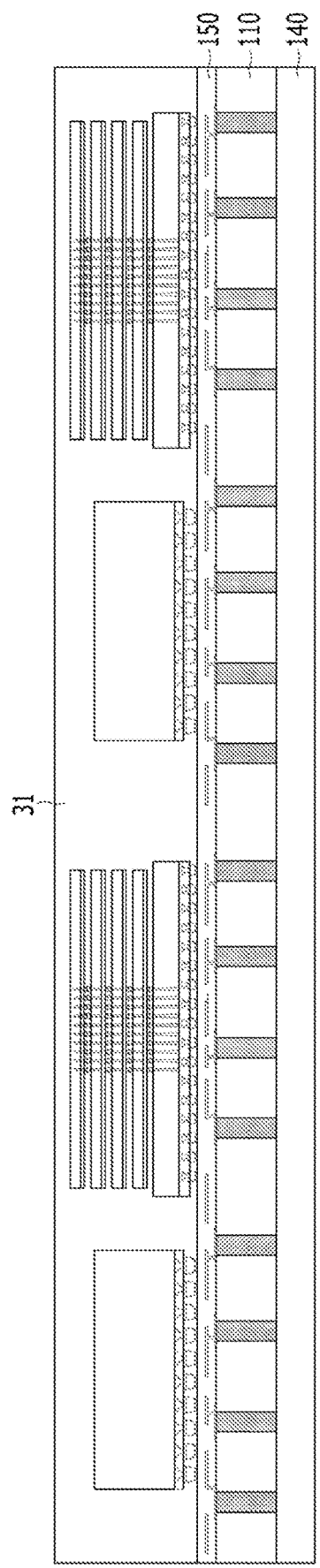

Referring to FIG. 20, a first molding material 31 is formed to seal the semiconductor chip 10.

The first molding material 31 may include a polymer material. In some embodiments, the first molding material 31 may be a molding compound layer. The molding compound layer may include an epoxy-based resin having a filler dispersed therein. The filler may include insulating fibers, insulating particles, other suitable elements, or combinations thereof. Thereafter, a portion of the first molding material 31 may be removed by chemical mechanical polishing (CMP) to unseal an upper surface of the semiconductor chip 10.

When the anodized film substrate base 120 is manufactured to have the same size and shape as the wafer, wafer-level packaging can be performed.

Figure 21:
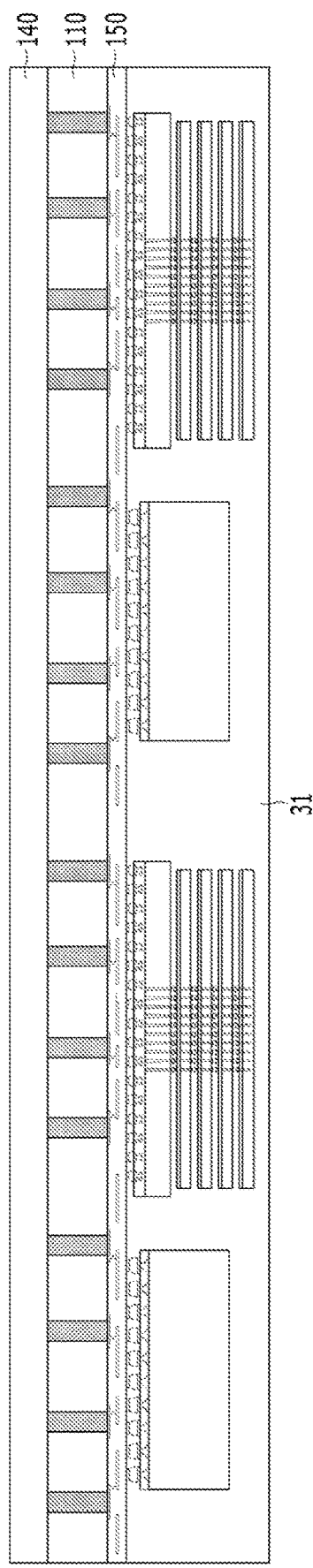

Referring to FIG. 21, the process described with reference to FIG. 20 can be reversed after being completed for the post-process. In this case, the semiconductor chip 10 is protected by the first molding material 31, and at the same time, the first molding material 31 performs a function of supporting the anodized film-based interposer 100.

Figure 22:
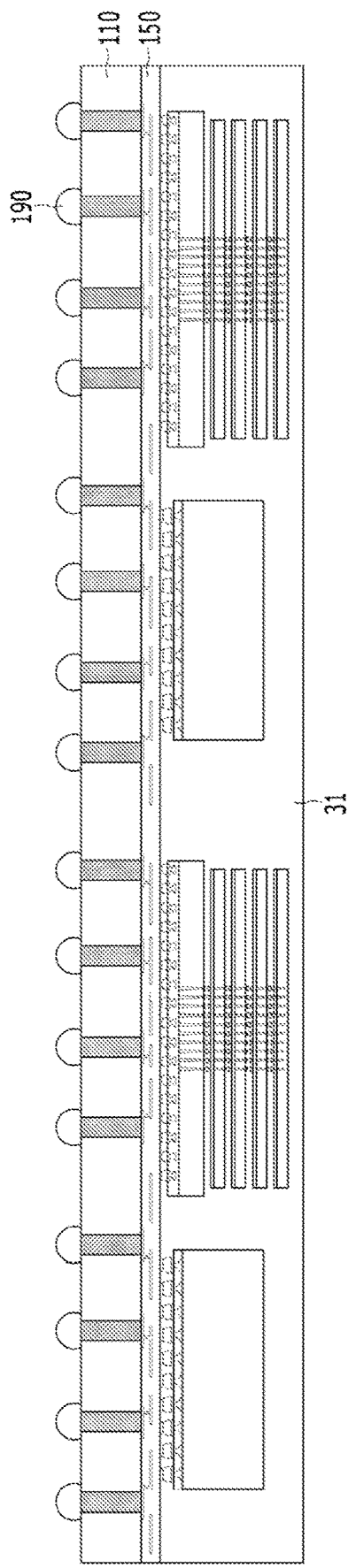

Referring to FIG. 22, the support substrate 140 is removed, and the external connection terminal 190 is formed at positions where the support substrate 140 is removed.

When the support substrate 140 is removed, the vertical conductive part 130 in the anodized film substrate 110 is unsealed, and the unsealed vertical conductive part 130 can be used for alignment in forming the external connection terminal 190. The vertical conductive part 130 in the anodized film substrate 110 functions as an alignment mark for the redistribution part 150 formed on one side, as well as an alignment mark for the external connection terminal 190 formed on the other side, so a separate process for forming alignment marks is not required. In addition, alignment errors can be minimized since the one side and the other side are aligned with respect to the vertical conductive parts 130. Here, the vertical conductive part 130 may include a functional vertical conductive part 130 to which the wiring pattern 170 of the redistribution part 150 is electrically connected, and a dummy vertical conductive part 130 to which the wiring pattern 170 of the redistribution part 150 is not electrically connected. The dummy vertical conductive part 130 functions as an alignment mark, and a plurality of the dummy vertical conductive parts 130 may be provided in an arrangement easily recognizable as a vision camera. In addition, the dummy vertical conductive part 130 is not electrically connected to the wiring pattern 170, and thus can be used for the purpose of heat dissipation of the semiconductor chip 10. The dummy vertical conductive part 130 may be manufactured in the same configuration as the vertical conductive part 130 described above.

On the other hand, as described with reference to FIG. 11, the external connection terminal 190 includes the lower via-connection pad 183 connected to the vertical conductive part 130, UBM 191 formed on the lower surface of the lower via-connection pad 183, and the solder bump 193 formed on the lower surface of UBM.

Figure 23:
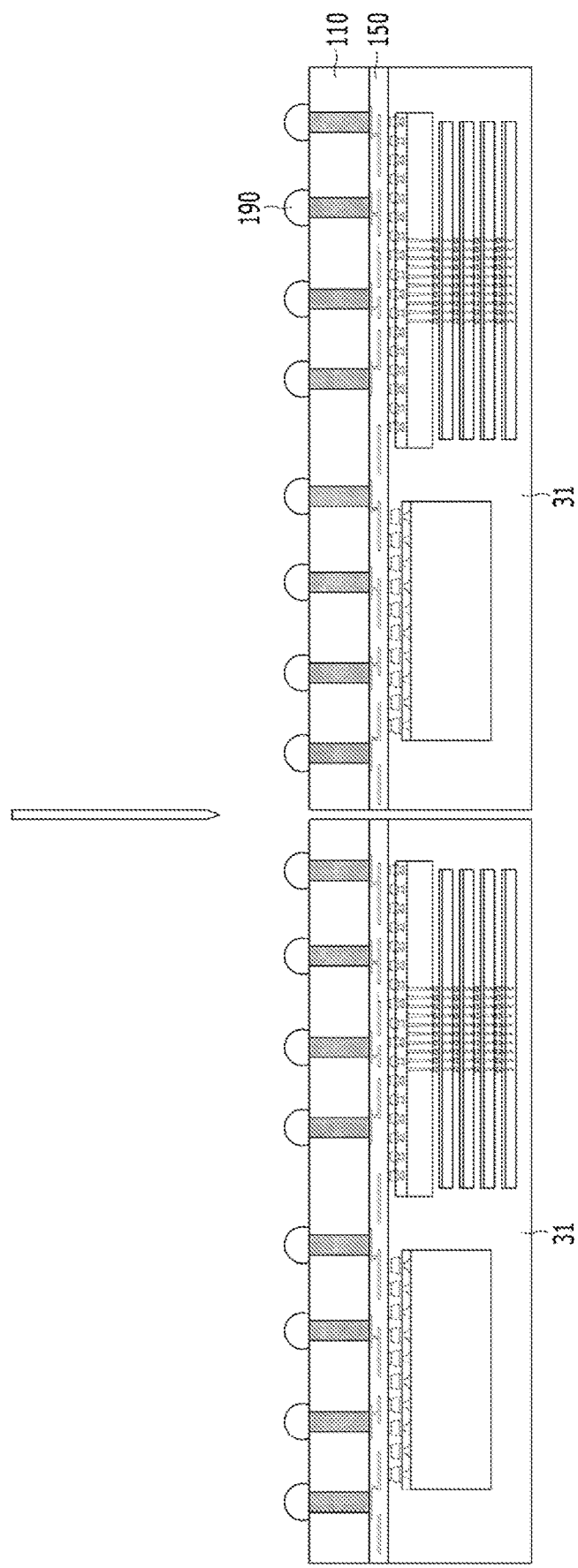

Referring to FIG. 23, the singulated semiconductor package 1 is fabricated by dicing along the dicing line DL. Although not shown in FIG. 23, the depression 123 may be formed in advance on at least one surface of the anodized film substrate base 120, and through the configuration, the anodized film substrate base 120, made of the anodized film, can be further easily and perfectly singulated.

Figure 24:
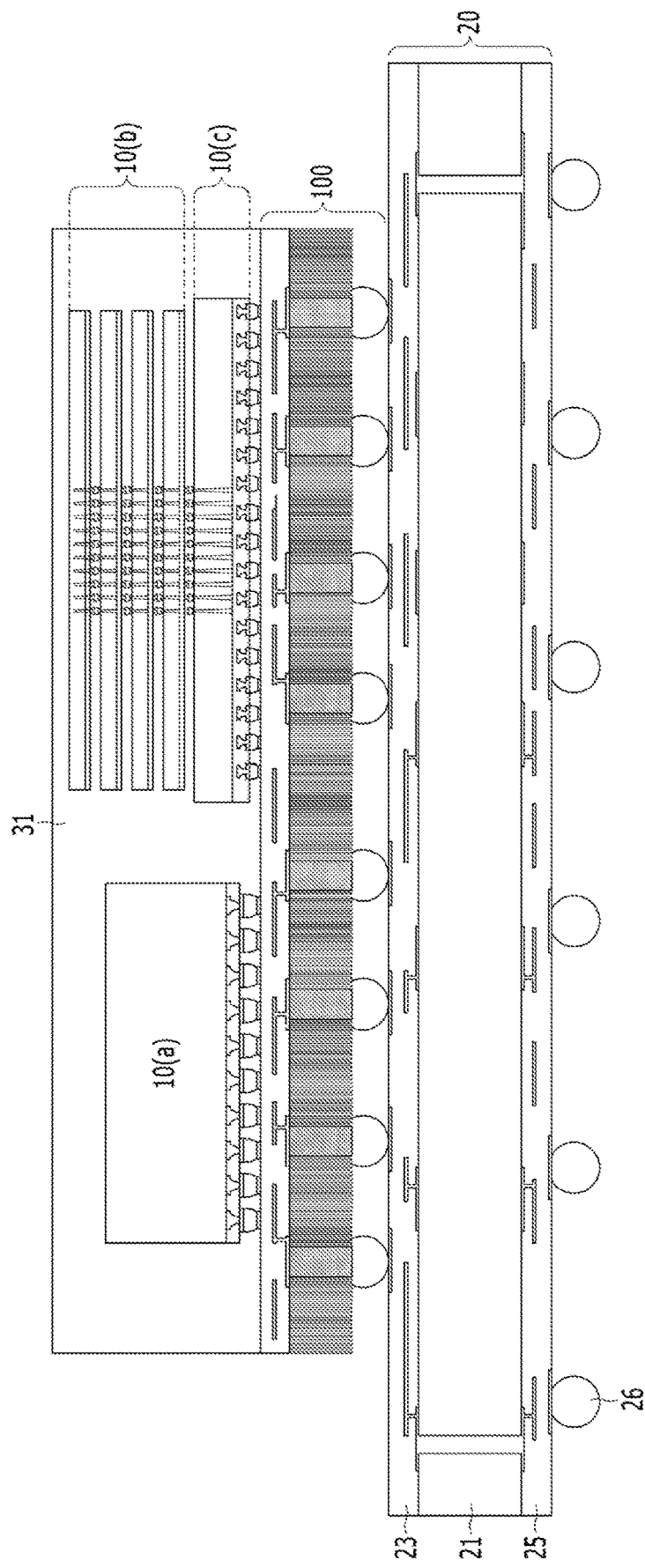
Figure 25:
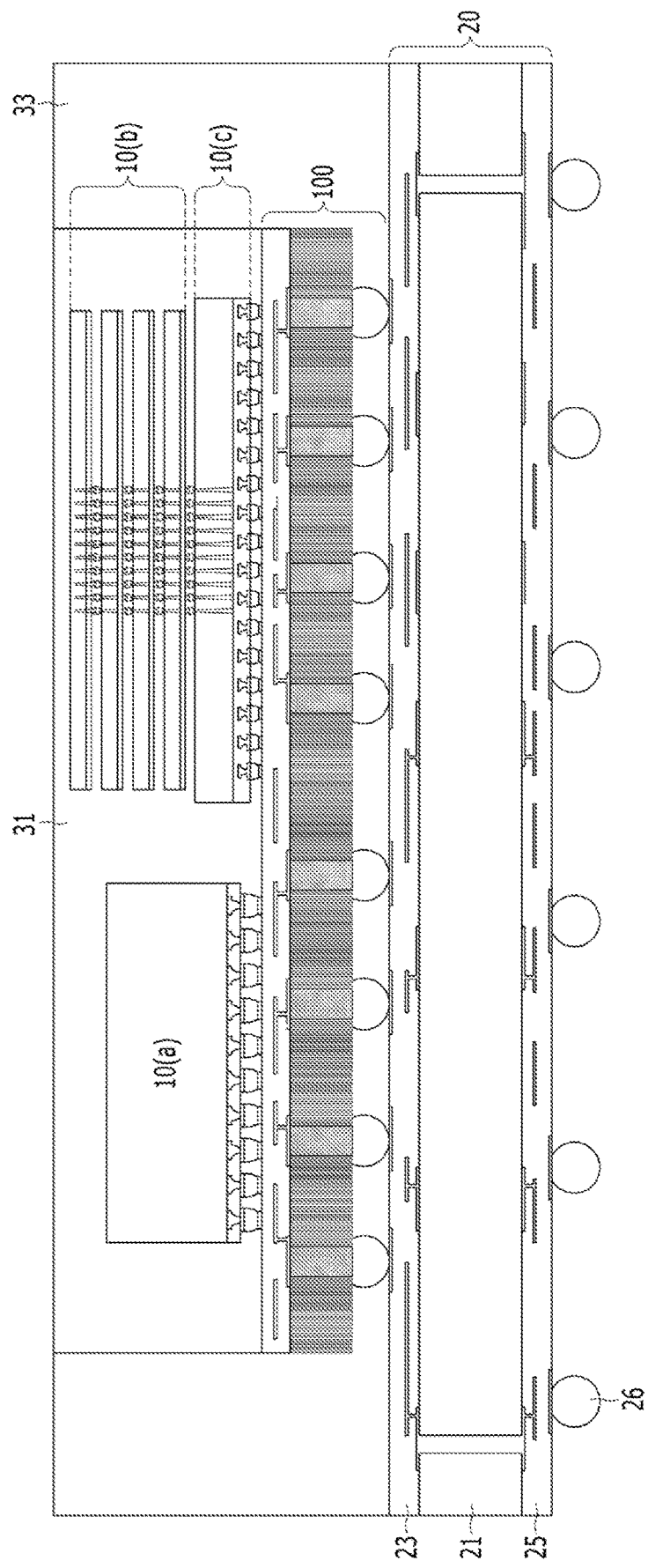

Referring to FIG. 24, the semiconductor chip 10 being molded by being mounted on the anodized film-based interposer 100 is mounted on the package substrate 20. Thereafter, referring to FIG. 25, the semiconductor package 1 is manufactured by being molded with the second molding material 33.

As described above, the present invention has been described with reference to the preferred embodiments. However, those skilled in the art will appreciate that various modifications, additions and substitutions are possible, without departing from the scope and spirit of the invention as disclosed in the accompanying claims.

EXPLANATION OF REFERENCE NUMERALS

10: SEMICONDUCTOR CHIP 20: PACKAGE SUBSTRATE
100: ANODIZED FILM-BASED INTERPOSER 110: ANODIZED FILM SUBSTRATE
120: ANODIZED FILM SUBSTRATE BASE 130: VERTICAL CONDUCTIVE PART
140: SUPPORT SUBSTRATE 150: REDISTRIBUTION PART
160: INSULATING LAYER 170: WIRING PATTERN
190: EXTERNAL CONNECTION TERMINAL

What is claimed is:

1. A semiconductor package, comprising:
a semiconductor chip; and
an anodized film-based interposer on which the semiconductor chip is mounted,
wherein the anodized film-based interposer comprises:
an anodized film substrate made of an anodized film and comprising a vertical conductive part provided therein; and
a redistribution part,
wherein the anodized film comprises a porous layer having a pore formed therein and a barrier layer sealing one end of the pore, and
wherein the redistribution part is provided on an upper surface of the barrier layer.

2. The semiconductor package of claim 1, wherein a package substrate is provided under the anodized film-based interposer, and
the anodized film-based interposer is interposed between the semiconductor chip and the package substrate.

3. An anodized film-based interposer, comprising:
an anodized film substrate, comprising a vertical conductive part provided in an anodized film substrate base made of an anodized film; and
a redistribution part, provided on at least one surface of the anodized film substrate,
wherein the anodized film comprises a porous layer having a pore formed therein and a barrier layer sealing one end of the pore, and
wherein the redistribution part is provided on an upper surface of the barrier layer.

4. An anodized film substrate, comprising:
- an anodized film substrate base, made of an anodized film and having a pore formed therein during an anodizing;
- a vertical conductive part, provided in the anodized film substrate base; and
- a barrier layer formed during the anodizing on at least one surface of the anodized film substrate base to seal one end of the pore.

5. The anodized film substrate of claim 4, further comprising a support substrate provided on at least one surface of the anodized film substrate base.

6. The anodized film substrate of claim 4, wherein the vertical conductive part is provided in a through hole formed by etching the anodized film to have a larger size than a pore formed during anodizing.

7. The anodized film substrate of claim 4, wherein the vertical conductive part is provided in a pore formed during anodizing.

8. The anodized film substrate of claim 6, further comprising a clearance formed between the through hole and the vertical conductive part.

9. The anodized film substrate of claim 4, wherein the vertical conductive part comprises a main conductive part and a buffer part being in contact with the main conductive part.

10. The anodized film substrate of claim 4, further comprising a via-connection pad formed on the anodized film substrate base and being in contact with the vertical conductive part,
- wherein one of the via-connection pads is connected to a plurality of the vertical conductive parts.

11. The anodized film substrate of claim 4, further comprising a depression formed by removing at least a portion of the anodized film.

12. An anodized film substrate base, made of an anodized film formed by anodizing a base metal and then removing the base metal, the anodized film substrate base comprising a through hole formed by etching the anodized film to have a larger size than a pore formed during the anodizing,
- wherein a sealed end of the pore is unsealed by removing a barrier layer formed on at least one surface side of the anodized film substrate base during the anodizing.

13. The anodized film substrate base of claim 12, further comprising a depression formed by removing at least a portion of the anodized film.

14. The anodized film substrate base of claim 12, wherein the through hole has a polygonal cross-section.

15. An anodized film substrate base, made of an anodized film formed by anodizing a base metal and then removing the base metal, the anodized film substrate base comprising:
- a through hole formed by etching the anodized film to have a larger size than a pore formed during the anodizing; and
- a barrier layer formed on at least one surface side of the anodized film substrate base during the anodizing to seal one end of the pore.

16. The anodized film substrate base of claim 12, further comprising a support substrate provided on at least one surface of the anodized film substrate base.

17. The anodized film substrate base of claim 15, further comprising a depression formed by removing at least a portion of the anodized film.

* * * * *